United States Patent
Lin et al.

(10) Patent No.: US 12,394,663 B2
(45) Date of Patent: Aug. 19, 2025

(54) ISOLATION WITH MULTI-STEP STRUCTURE

(71) Applicant: TAIWAN SEMICONDUCTOR MANUFACTURING COMPANY, LTD., Hsinchu (TW)

(72) Inventors: Ta-Chun Lin, Hsinchu (TW); Tien-Shao Chuang, Hsinchu (TW); Kuang-Cheng Tai, Hsinchu (TW); Chun-Hung Chen, Hsinchu (TW); Chih-Hung Hsieh, Hsin-Chu (TW); Kuo-Hua Pan, Hsinchu (TW); Jhon-Jhy Liaw, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 149 days.

(21) Appl. No.: 18/343,947

(22) Filed: Jun. 29, 2023

(65) Prior Publication Data
US 2023/0360961 A1  Nov. 9, 2023

Related U.S. Application Data

(60) Continuation of application No. 17/583,707, filed on Jan. 25, 2022, now Pat. No. 11,728,206, which is a (Continued)

(51) Int. Cl.
*H01L 21/762* (2006.01)
*H10D 30/62* (2025.01)
(Continued)

(52) U.S. Cl.
CPC .. *H01L 21/76232* (2013.01); *H01L 21/76224* (2013.01); *H10D 30/6211* (2025.01);
(Continued)

(58) Field of Classification Search
CPC ........... H01L 21/76232; H10D 84/0151–0153; H10D 84/0158; H10D 84/038; H10D 84/834; H10D 84/853; H10D 84/859
See application file for complete search history.

(56) References Cited

U.S. PATENT DOCUMENTS 8,796,666 B1  8/2014  Huang et al.
8,815,712 B2  8/2014  Wan et al.
(Continued)

*Primary Examiner* — Daniel P Shook
(74) *Attorney, Agent, or Firm* — Cooper Legal Group, LLC

(57) ABSTRACT

A semiconductor device structure is provided. The semiconductor device structure includes a semiconductor substrate including a first well region of a first conductivity type. The semiconductor device structure also includes a first fin structure and an adjacent second fin structure formed in and protruding from the first well region. The semiconductor device structure also includes a first isolation structure formed in the first well region between the first fin structure and the second fin structure. A first sidewall surface of the first fin structure faces to a second sidewall surface of the second fin structure. The first sidewall surface and the second sidewall surface each extend along at least two directions from a bottom of the first isolation structure to a top of the first isolation structure.

20 Claims, 20 Drawing Sheets

Related U.S. Application Data continuation of application No. 17/018,397, filed on Sep. 11, 2020, now Pat. No. 11,251,069, which is a division of application No. 16/211,949, filed on Dec. 6, 2018, now Pat. No. 10,790,184.

(60) Provisional application No. 62/738,305, filed on Sep. 28, 2018.

(51) Int. Cl.
*H10D 62/10* (2025.01)
*H10D 64/01* (2025.01)
*H10D 84/01* (2025.01)
*H10D 84/03* (2025.01)
*H10D 84/83* (2025.01)
*H10D 84/85* (2025.01)

(52) U.S. Cl.
CPC ......... *H10D 62/115* (2025.01); *H10D 64/015* (2025.01); *H10D 64/017* (2025.01); *H10D 84/0151* (2025.01); *H10D 84/0158* (2025.01); *H10D 84/0188* (2025.01); *H10D 84/0191* (2025.01); *H10D 84/0193* (2025.01); *H10D 84/038* (2025.01); *H10D 84/834* (2025.01); *H10D 84/853* (2025.01); *H10D 84/859* (2025.01)

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2013/0270652 A1* | 10/2013 | Liaw | H10D 30/6212 257/E27.06 |
| 2015/0263003 A1 | 9/2015 | Lee et al. | |
| 2016/0027684 A1 | 1/2016 | Chang et al. | |

\* cited by examiner

ISOLATION WITH MULTI-STEP STRUCTURE

PRIORITY CLAIM AND CROSS-REFERENCE

This Application is a Continuation of pending U.S. patent application Ser. No. 17/583,707, filed Jan. 25, 2022, which a Continuation of pending U.S. patent application Ser. No. 17/018,397, filed Sep. 11, 2020, which is Divisional of pending U.S. patent application Ser. No. 16/211,949, filed Dec. 6, 2018, which claims the benefit of U.S. Provisional Application No. 62/738,305, filed on Sep. 28, 2018, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The advantages of a FinFET include a reduction of the short-channel effect and a higher current flow.

Although existing FinFET manufacturing processes have generally been adequate for their intended purposes, they have not been entirely satisfactory in all respects, especially as device scaling-down continues. For example, well leakage (which can cause latch-up) becomes increasingly important as the fin structure and the shallow trench isolation (STI) are shrunk. It is a challenge to form reliable FinFET device at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
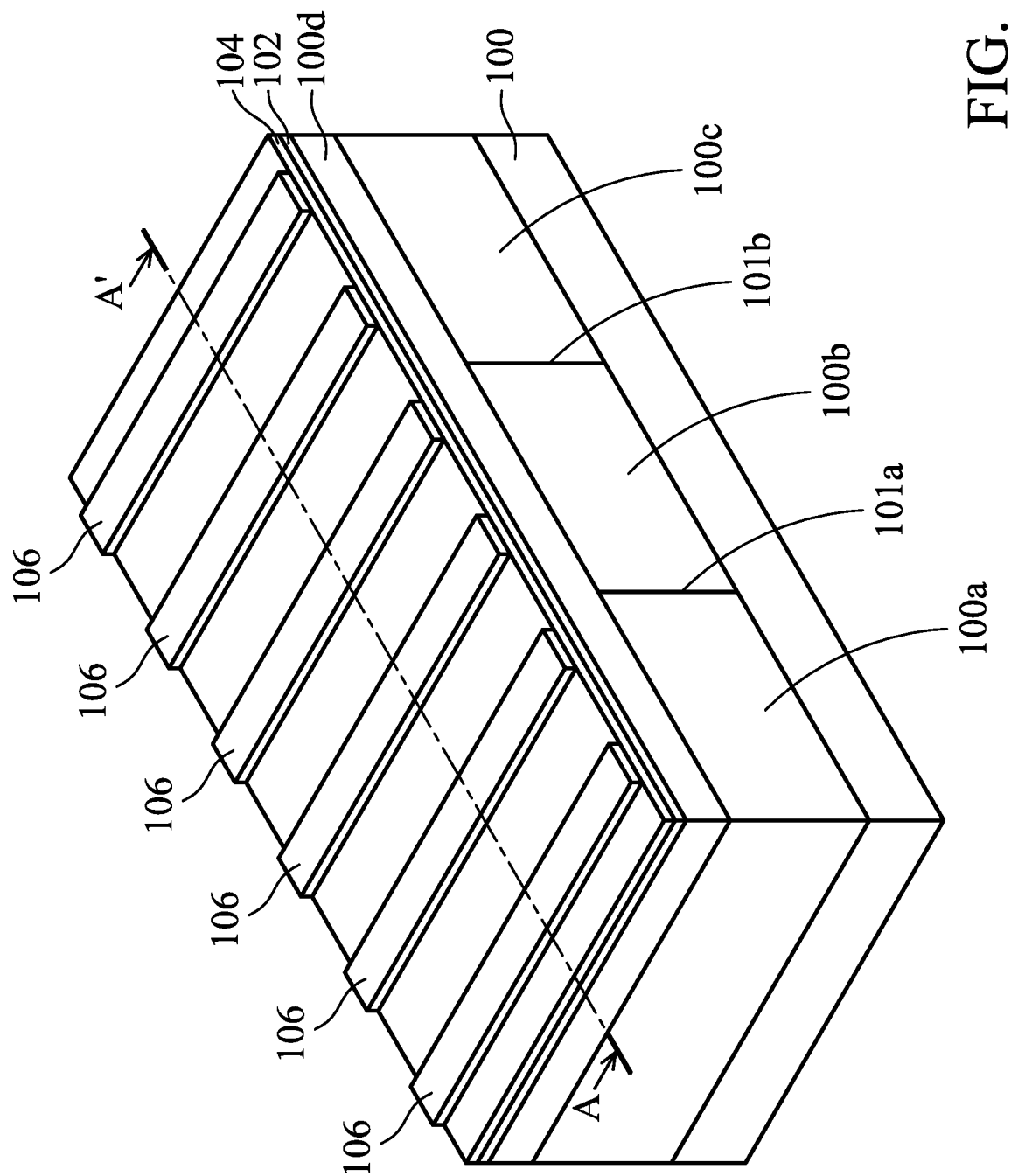
FIGS. 1A to 1I illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures may include a semiconductor substrate having a first well region and a second well region that have different conductivity types and are adjacent to each other. A first fin structure and a second fin structure are respectively formed in the first well region and the second well region. The first fin structure and the second fin structure protrude from the semiconductor substrate and are adjacent to each other. Afterwards, a multi-step isolation structure is formed between the first fin structure and the second fin structure. The multi-step isolation structure includes a first isolation portion corresponding to the upper portions of the first fin structure and the second fin structure, and a second isolation portion extending from the bottom surface of the first isolation portion. The second isolation portion has a top width that is narrower than the bottom width of the first isolation portion, so that the fin structures on opposite sides of the multi-step isolation structure have a reverse T-like shape.

Figure 1B:
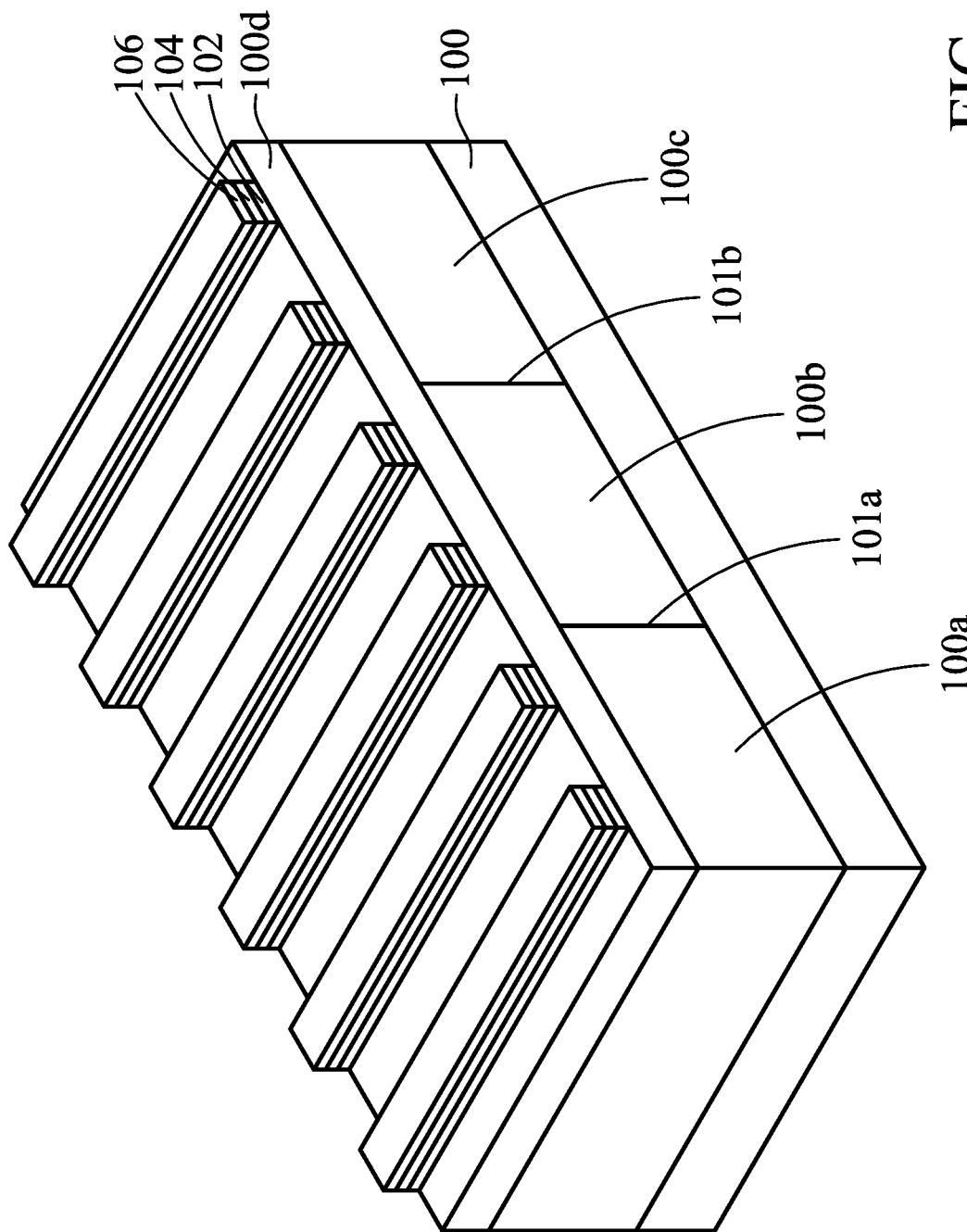
Figure 1C:
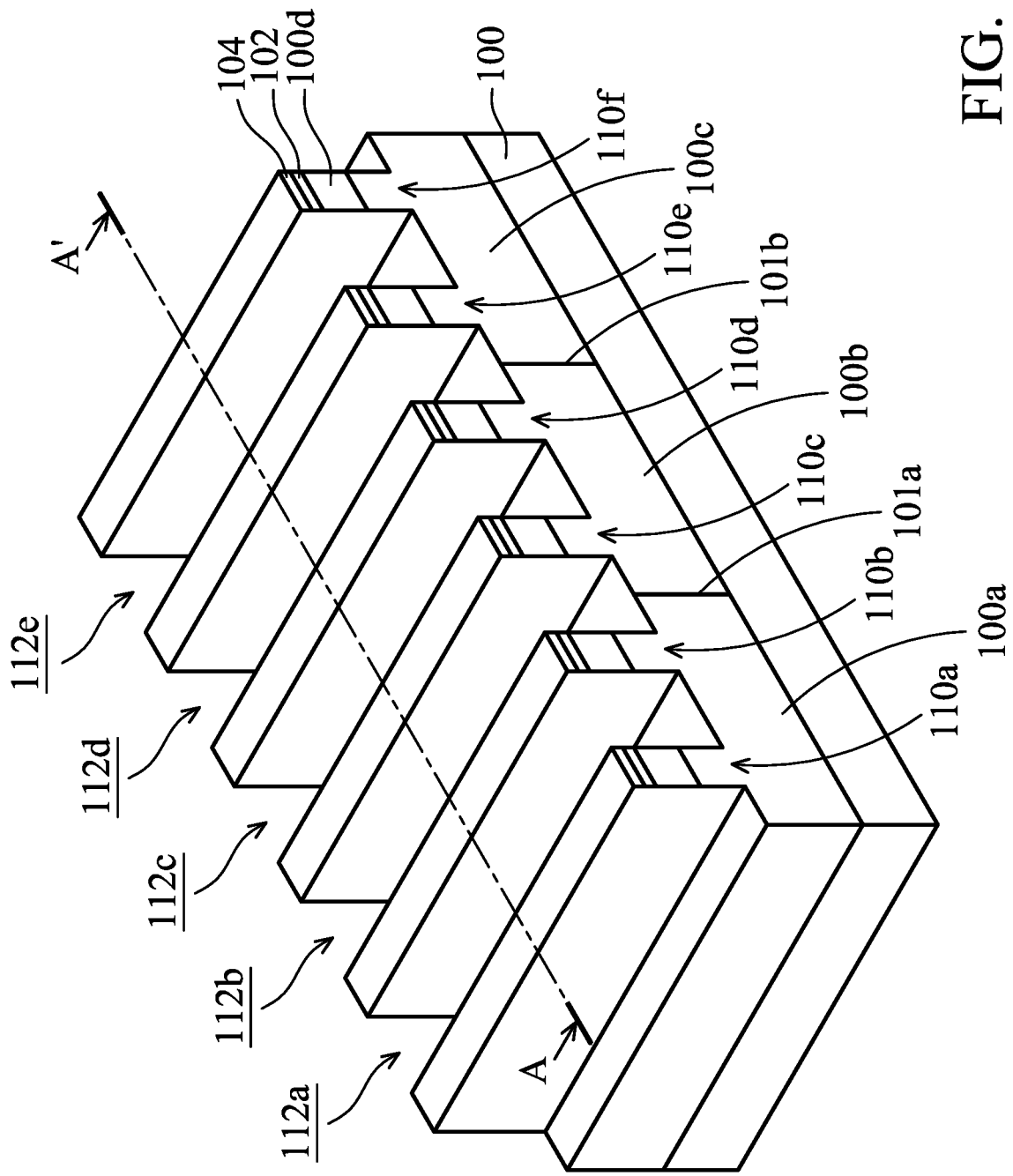
Figure 1D:
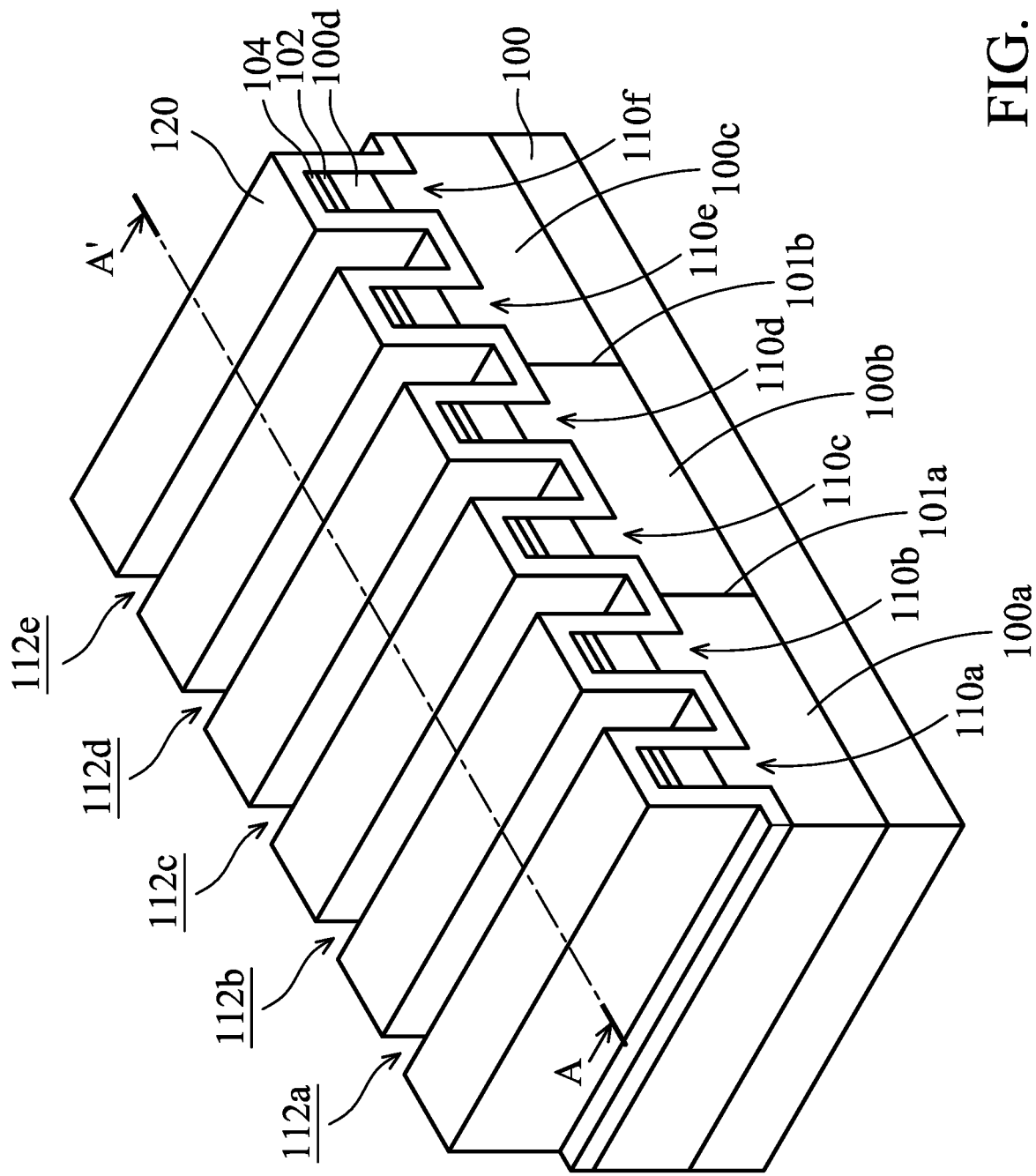
Figure 1E:
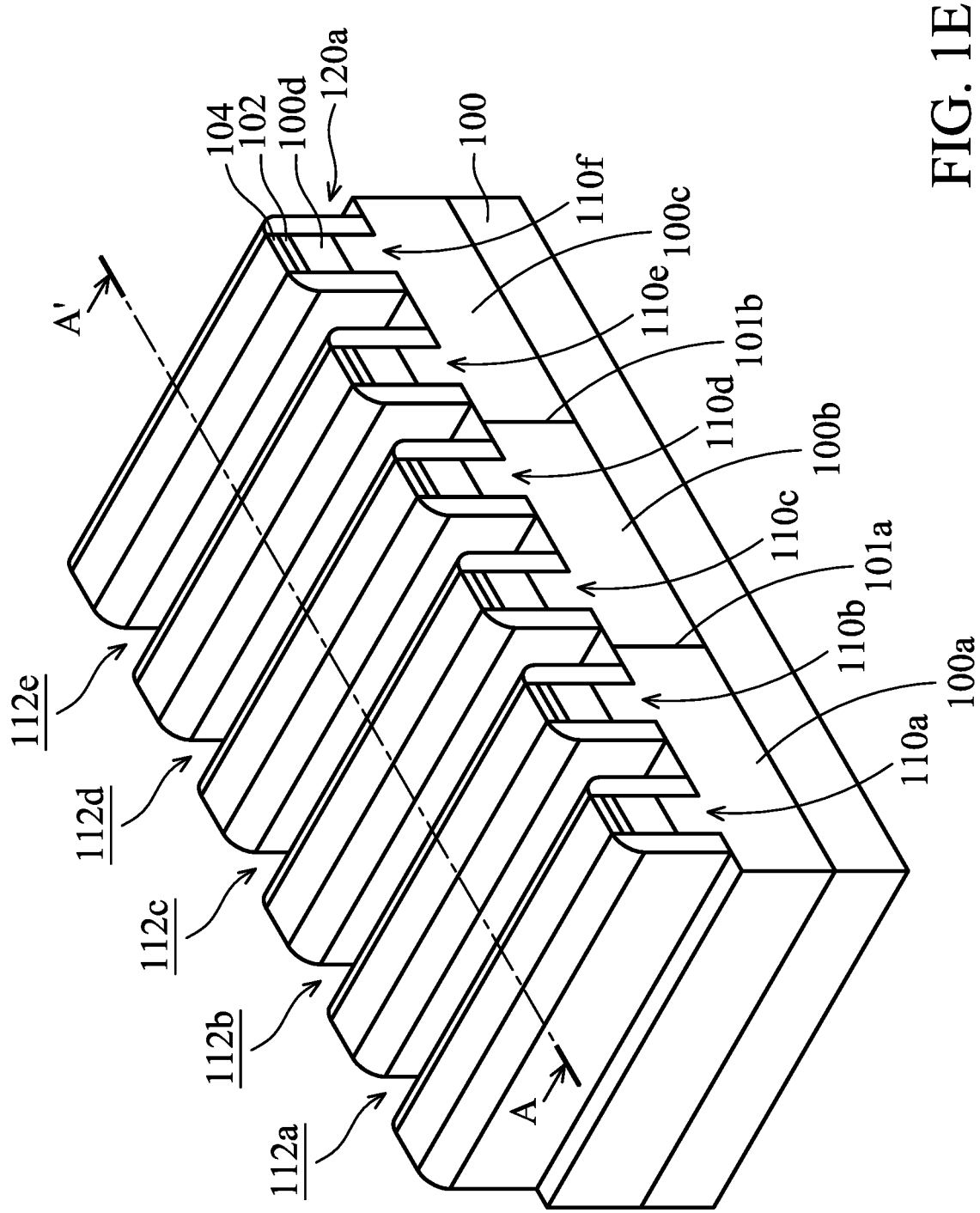
Figure 1F:
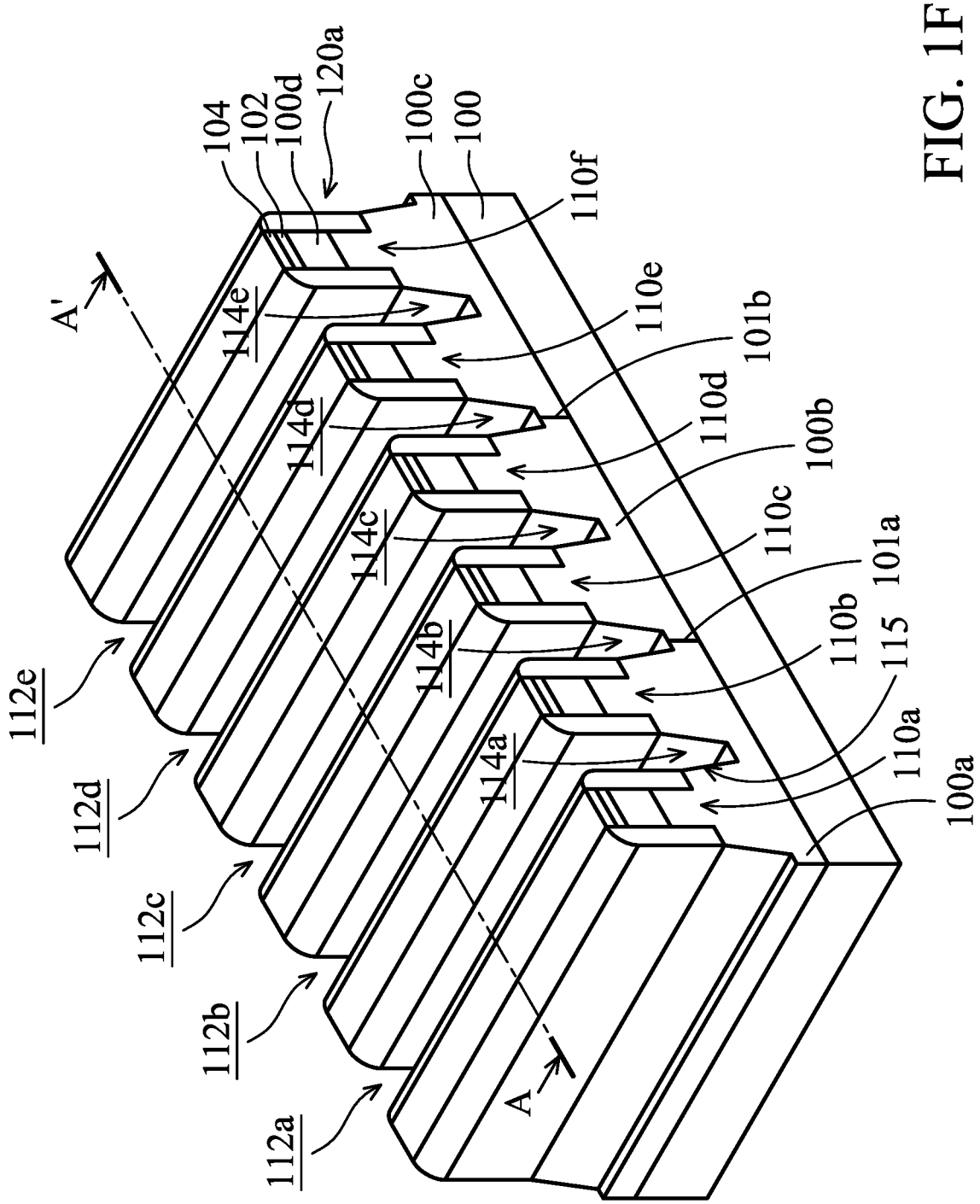
Figure 1G:
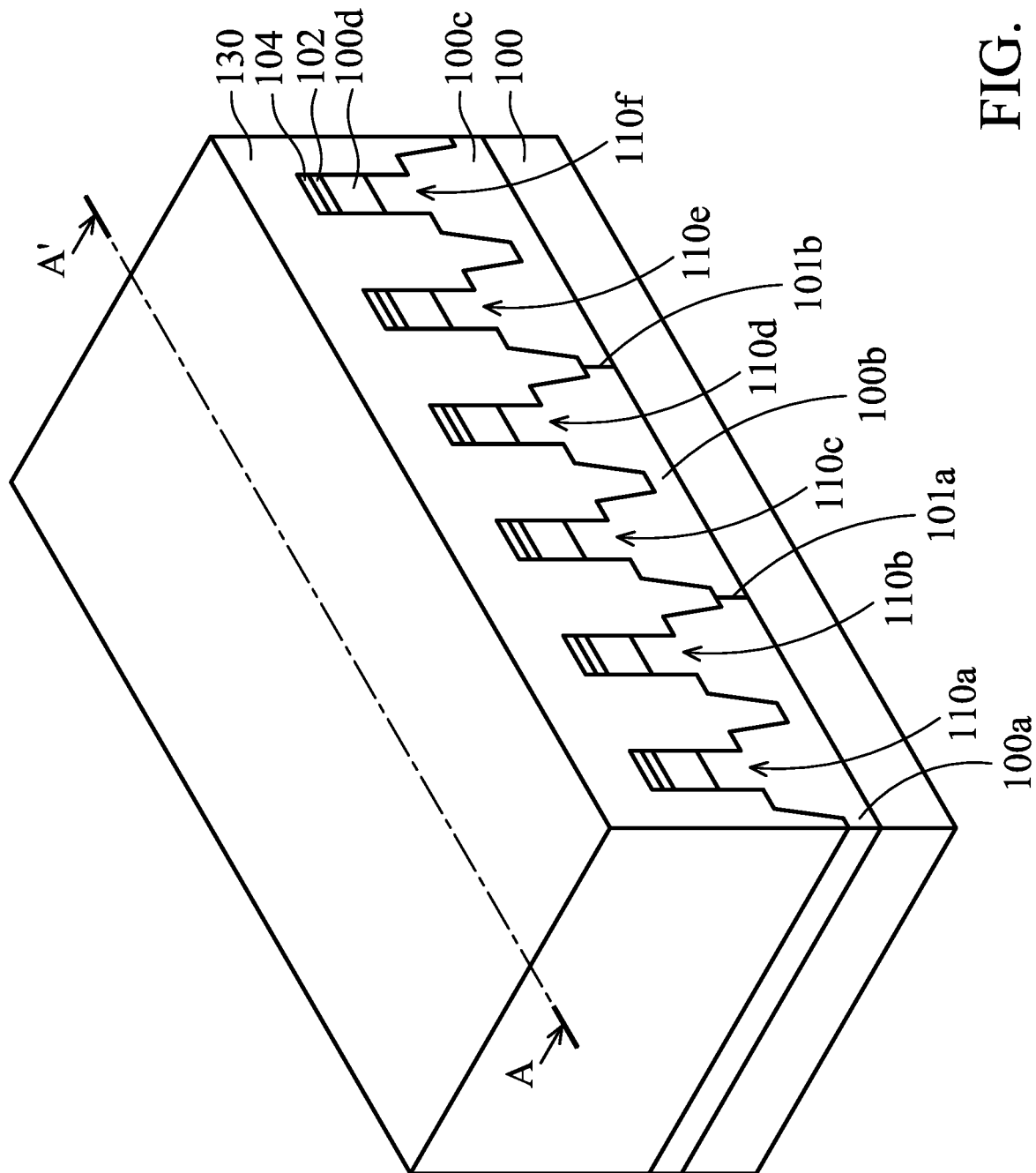
Figure 1H:
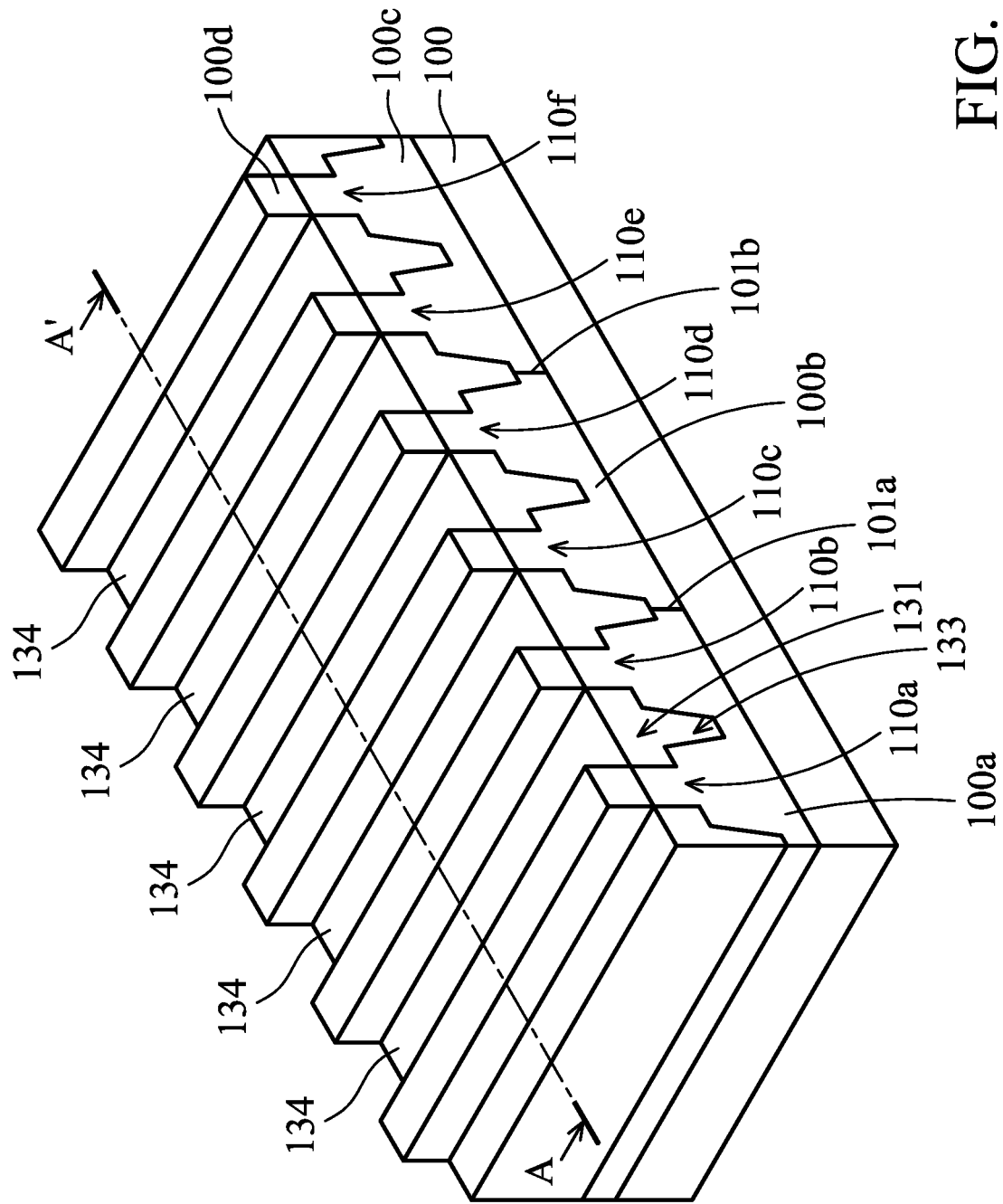
Figure 1I:
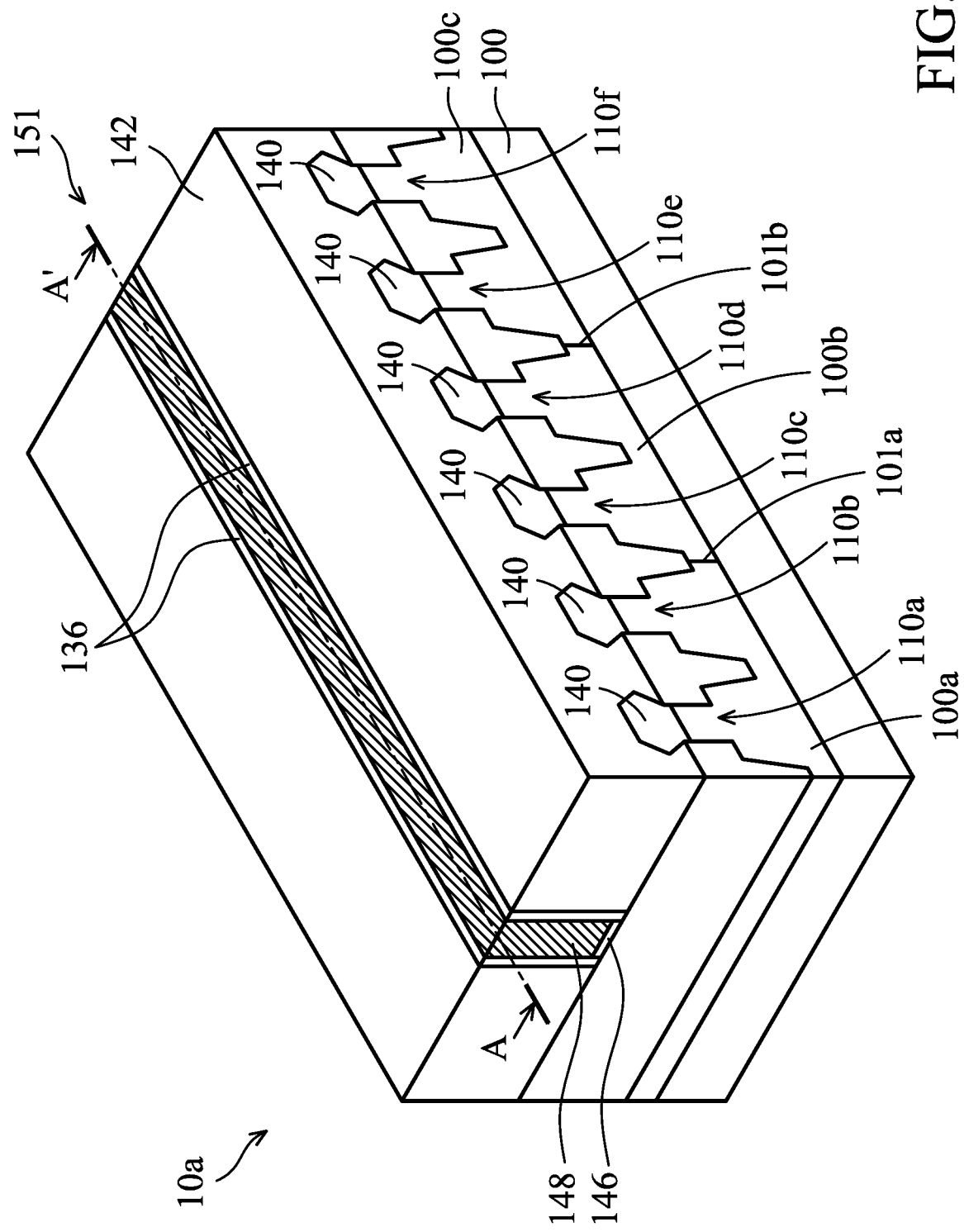
Figure 2A:
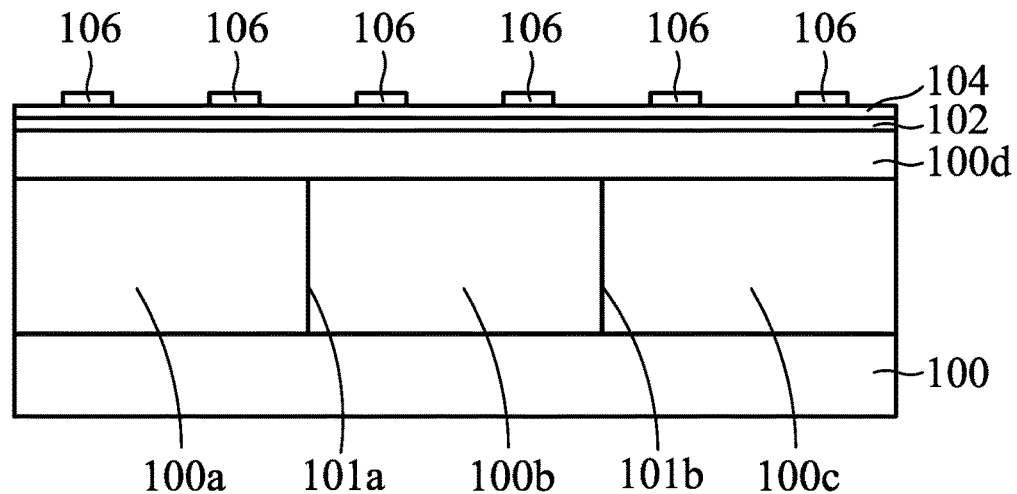
FIGS. 2A to 2I illustrate cross-sectional representations of various stages of manufacturing a semiconductor device structure in accordance with some embodiments.

FIGS. 1A to 1I illustrate perspective views of various stages of manufacturing a semiconductor device structure 10a and FIGS. 2A to 2I illustrate cross-sectional representations of various stages of manufacturing the semiconductor device structure 10a in accordance with some embodiments. In addition, FIGS. 2A to 2I illustrate the cross-sectional representations of the semiconductor device structure shown along line A-A' in FIGS. 1A to 1I in accordance with some embodiments. In some embodiments, the semiconductor device structure is implemented as a fin field effect transistor (FinFET) structure. As shown in FIGS. 1A and 2A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) and/or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 includes a PMOS region for P-type FinFETs formed thereon. The PMOS region of the substrate 100 may include Si, SiGe, SiGeB, or an III-V group semiconductor material (such as InSb, GaSb, or InGaSb). In some embodiments, the substrate 100 includes an NMOS region for N-type FinFETs formed thereon. The NMOS region of the substrate 100 may include Si, SiP, SiC, SiPC, or an III-V group semiconductor material (such as InP, GaAs, AlAs, InAs, InAlAs, or InGaAs).

In some other embodiments, the substrate 100 includes one or more PMOS regions and one or more NMOS regions. For example, the substrate 100 may include well regions 100a-100c adjacent to each other. The well region 100b may have a first conductivity type (e.g., N-type) and be formed between and adjacent to the well region 100a and the well region 100c that have a second conductivity type (e.g., P-type), so that a well interface 101a is formed between the well region 100a and the well region 100b, and a well interface 101b is formed between the well region 100c and the well region 100b. In those cases, the well region 100b serves as the NMOS region and the well region 100b serve as the PMOS region. In some other embodiments, the substrate 100 includes an undoped region 100d formed on the well regions 100a-100c. The undoped region 100d may be used as channel regions for FinFETs formed on the substrate 100.

Afterwards, a mask structure is formed over the substrate 100 in accordance with some embodiments. More specifically, a first masking layer 102 and a second masking layer 104 of the mask structure are successively stacked over the substrate 100 for the subsequent patterning process. In some embodiments, the first masking layer 102 may be used as an etch stop layer when the second masking layer 104 is patterned. The first masking layer 102 may also be used as an adhesion layer that is formed between the undoped region 100d of the substrate 100 and the second masking layer 104.

In some embodiments, the first masking layer 102 is made of silicon oxide and is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the second masking layer 104 is made of silicon oxide, silicon nitride, silicon oxynitride, or another applicable material. In some other embodiments, more than one second masking layer 104 is formed over the first masking layer 102. In some embodiments, the second masking layer 104 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After formation of the first masking layer 102 and the second masking layer 104 of the mask structure, a patterned photoresist layer 106 may be formed over the second masking layer 104 for subsequent definition of one or more fin structures in the substrate 100. In some embodiments, the patterned photoresist layer 106 is formed by a photolithography process. The photolithography process may include photoresist coating (e.g., spin-on coating), soft baking, mask aligning, exposure, post-exposure baking, developing the photoresist, rinsing and drying (e.g., hard baking).

Figure 2B:
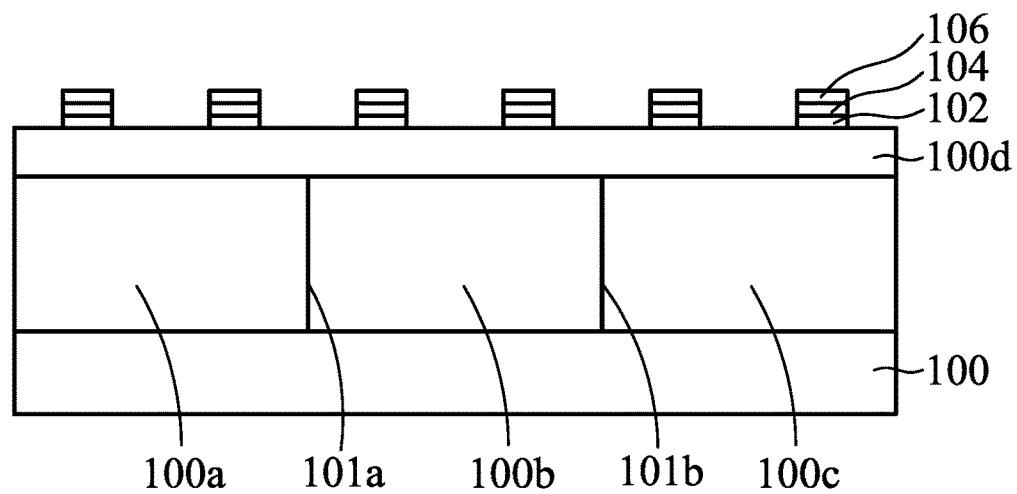

The first masking layer 102 and the second masking layer 104 of the mask structure are patterned by using the patterned photoresist layer 106 as an etch mask, as shown in FIGS. 1B and 2B in accordance with some embodiments. After the first masking layer 102 and the overlying second masking layer 104 are etched, a patterned first masking layer 102 and a patterned second masking layer 104 are formed, so that portions of the undoped region 100d of the substrate 100 are exposed.

Figure 2C:
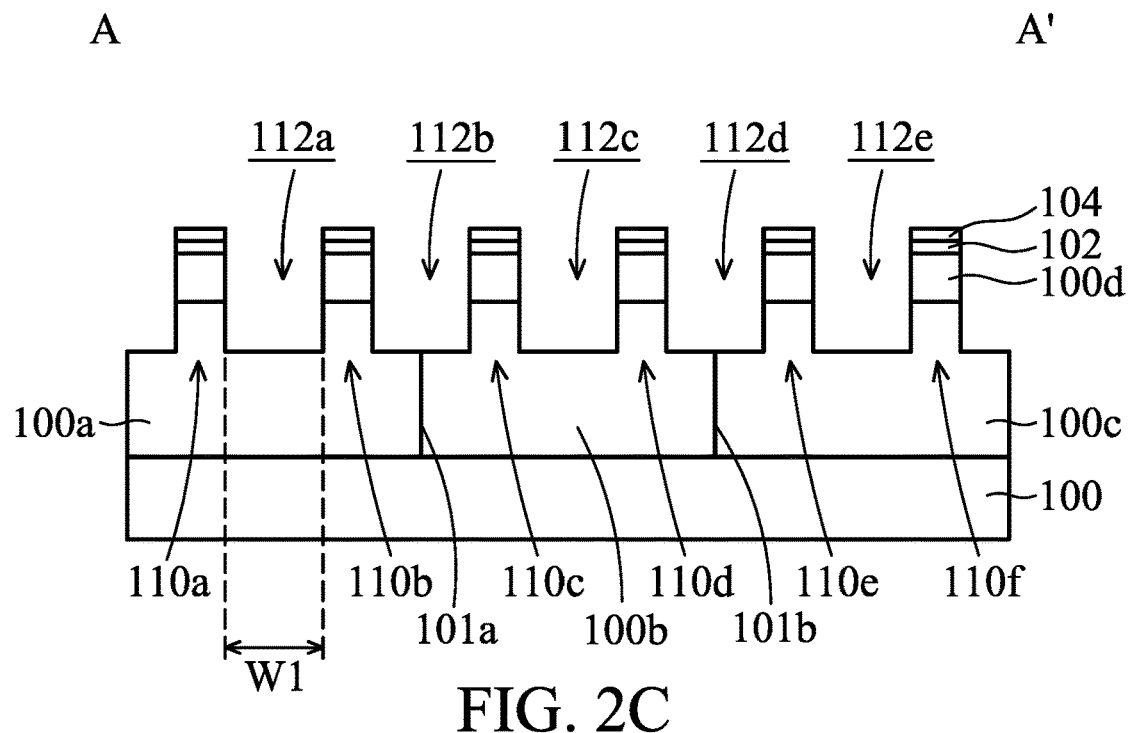

After the portions of the undoped region 100d of the substrate 100 are exposed by forming the patterned first masking layer 102 and the patterned second masking layer 104, the patterned photoresist layer 106 is removed, in accordance with some embodiments. Afterwards, the substrate 100 is patterned by one or more etching processes using the patterned first masking layer 102 and the patterned second masking layer 104 as an etch mask, as shown in FIGS. 1C and 2C in accordance with some embodiments.

More specifically, the exposed portions of the undoped region 100d of the substrate 100 are removed, and the well regions 100a-100c below the exposed portions of the undoped region 100d of the substrate 100 are partially removed by an etching process using the patterned second masking layer 104 and the patterned first masking layer 102 as an etch mask. As a result, fin structures and trenches in the substrate 100 are formed. In order to simplify the diagram, fin structures 110a-110f protruding from the substrate 100 and trenches 112a-112e are depicted as an example. In some embodiments, each of the fin structures 110a-110f has a width that gradually increases from the top portion to the bottom portion, so that each of the fin structures 110a-110f has a tapered fin width and sidewall. In some embodiments, each of the trenches 112a-112e has substantially the same width (e.g., the width W1 shown in FIG. 2C).

In some embodiments, the fin structure 110a and the fin structure 110b are defined in the well region 100a by forming the trench 112a in the well region 100a between the fin structure 110a and the fin structure 110b. The fin structure 110c and the fin structure 110d are defined in the well region 100b by forming the trench 112c in the well region 100b between the fin structure 110c and the fin structure 110d. The fin structure 110e and the fin structure 110f are defined in the well region 100c by forming the trench 112e in the well region 100c between the fin structure 110e and the fin structure 110f.

In addition, the trench 112b is formed between the fin structure 110b and the fin structure 110c and directly above the interface 110a between the well region 100a and the well region 100b, so that the interface 110a is exposed from the trench 112b. Similarly, the trench 112d is formed between the fin structure 110d and the fin structure 110e and directly above the interface 110b between the well region 100b and the well region 100c, so that the interface 110b is exposed from the trench 112d.

In some embodiments, the etching process for formation of fin structures 110a-110f is a dry etching process or a wet etching process. For example, the substrate 100 is etched by a dry etching process, such as a reactive ion etching (RIE), neutral beam etching (NBE), the like, or a combination thereof. The etching process may be a time-controlled process, and continue until the fin structures 110a-110f are formed and reach a predetermined height. A person of ordinary skill in the art will readily understand other methods of forming the fin structures, which are contemplated within the scope of some embodiments.

Figure 2D:
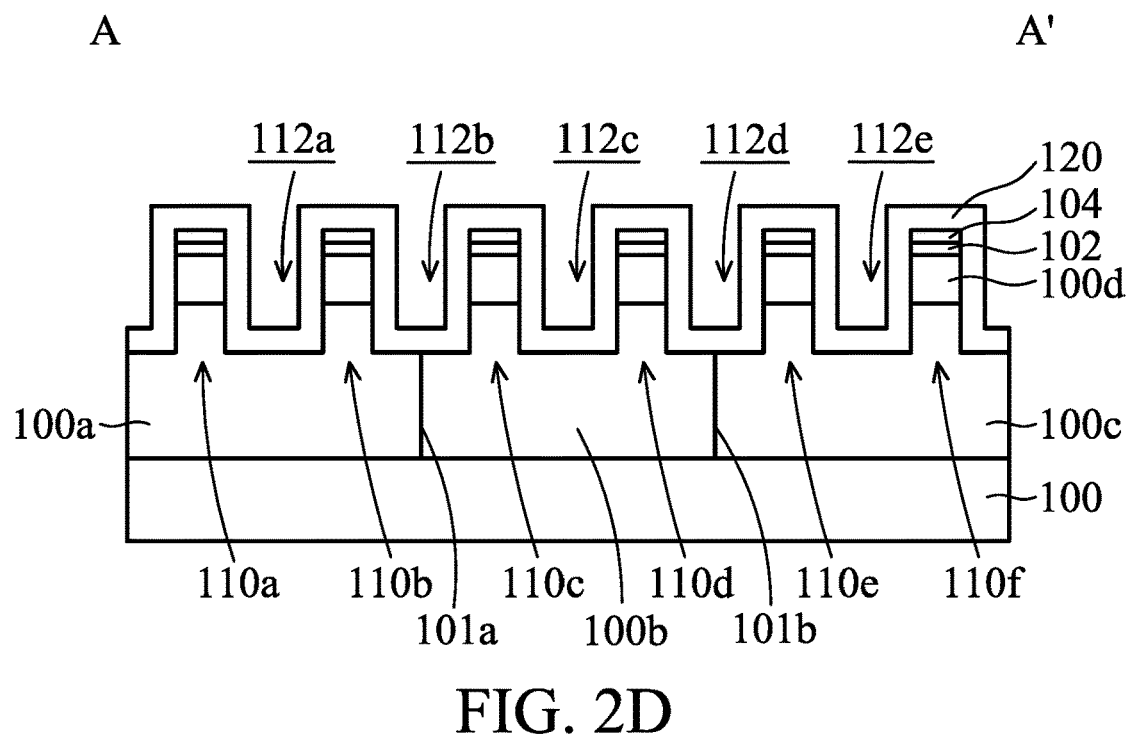

After the fin structures 110a-110f are formed, an insulating layer 120 is formed over the substrate 100 to conformally cover the sidewalls and the top surfaces of the fin structures 110a-100f, and the bottom of the trenches 112a-112e, as shown in FIGS. 1D and 2D in accordance with some embodiments. In some embodiments, the insulating layer 120 is made of silicon oxide, silicon nitride, silicon oxynitride, silicon carbide (SiC), fluorosilicate glass (FSG), a low-k dielectric material, or another suitable dielectric material. The insulating layer 120 may be deposited by a chemical vapor deposition (CVD) process, a flowable CVD (FCVD) process, a spin-on-glass process, or another applicable process.

Afterwards, an insulating layer 120 is formed over the substrate 100 to cover the fin structures 110, as shown in FIG. 1D in accordance with some embodiments. In some embodiments, the insulating layer 120 is made of silicon oxide, fluorosilicate glass (FSG), a low-k dielectric material, and/or another suitable dielectric material or another low-k dielectric material. The insulating layer 120 may be deposited by a chemical vapor deposition (CVD) process, a flowable CVD (FCVD) process, an atomic layer deposition (ALD) process, or another applicable process.

Figure 2E:
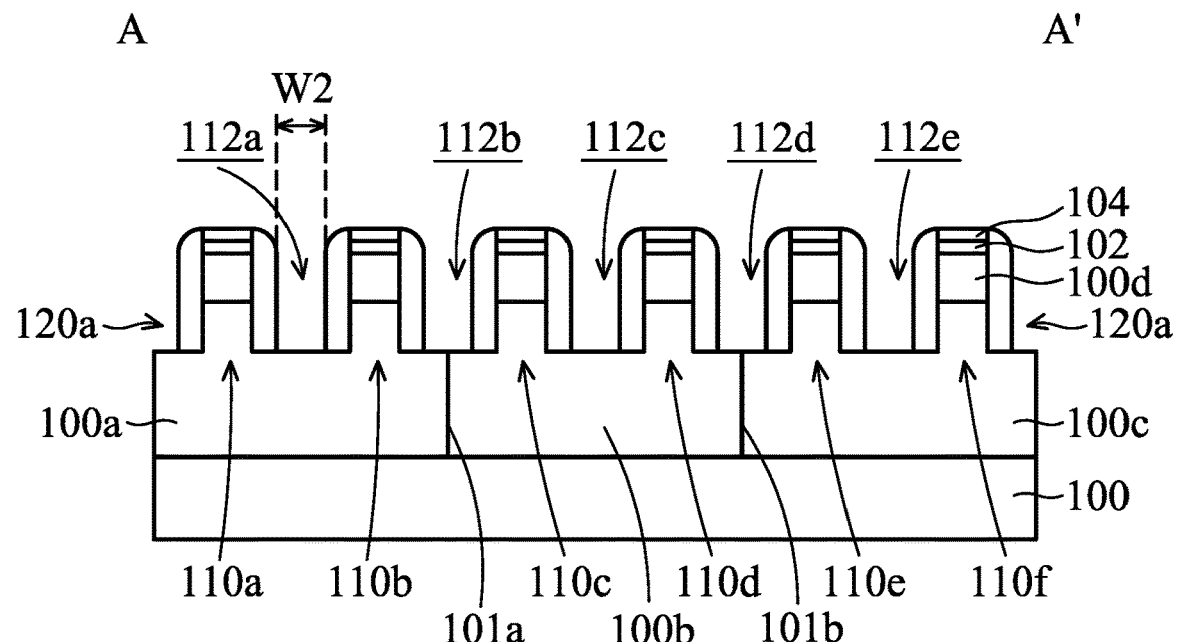

After the insulating layer 120 is formed, the insulating layer 120 is etched to form insulating spacers 120a over the substrate 100, as shown in FIGS. 1E and 2E in accordance with some embodiments. In some embodiments, the insulating layer 120 is anisotropic etched using, for example, a dry etching process, so as to remove the insulating layer 120 on the top surfaces of the fin structures 110a-110f and the bottom of the trenches 112a-112e. As a result, the insulating spacers 120a are formed on opposite sidewalls of each of the trenches 112a-112e, so that portions of the well regions 110a-110c including the well interfaces 101a and 101b are exposed through the trenches 112a-112e. In some embodiments, each of the trenches 112a-112e having insulating spacers 120a formed therein has substantially the same width (e.g., the width W2 shown in FIG. 2E) that is less than the width W1 shown in FIG. 2C.

Figure 2F:
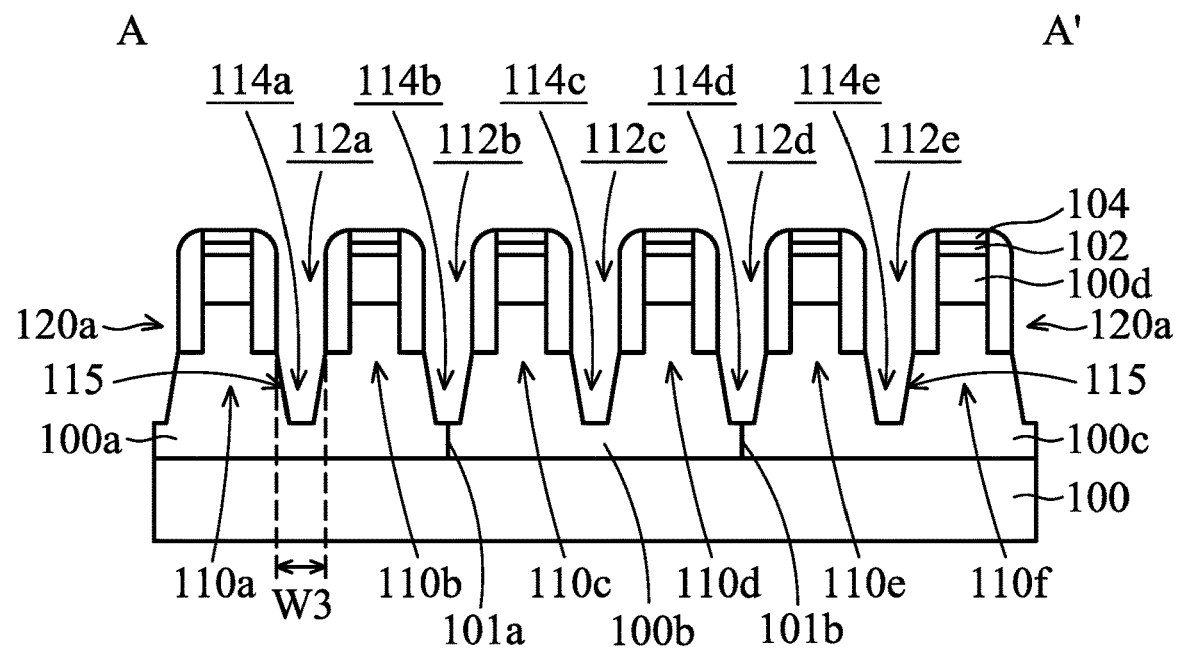

After the insulating spacers 120a are formed, trenches 114a-114e are formed in the well regions 100a-100c of the substrate 100 and respectively below the trenches 112a-112e, as shown in FIGS. 1F and 2F in accordance with some embodiments. In some embodiments, the exposed portions of the well regions 110a-110c below the trenches 112a-112e are etched by an anisotropic etching process using the insulating spacers 120a as an etch mask. For example, the well regions 110a-110c of the substrate 100 are etched by a dry etching process, such as a reactive ion etching (RIE), neutral beam etching (NBE), the like, or a combination thereof.

After the anisotropic etching process, the trenches 114a-114e with tilted sidewalls 115 are respectively extended from the bottom surface of the trenches 112a-112e into the well regions of substrate 100, so that each of the trenches 114a-114e has a top width W3 that is substantially equal to the width W2 shown in FIG. 2E and less than the width W1 shown in FIG. 2C. As shown in FIGS. 1F and 2F, the trench 114b is formed between the well region 100a and the well region 110b and directly above the interface 110a in accordance with some embodiments, so that the interface 110a is exposed from the trench 114b. Similarly, the trench 114d is formed between the well region 100b and the well region 100c and directly above the interface 110b in accordance with some embodiments, so that the interface 110b is exposed from the trench 114d.

Figure 2G:
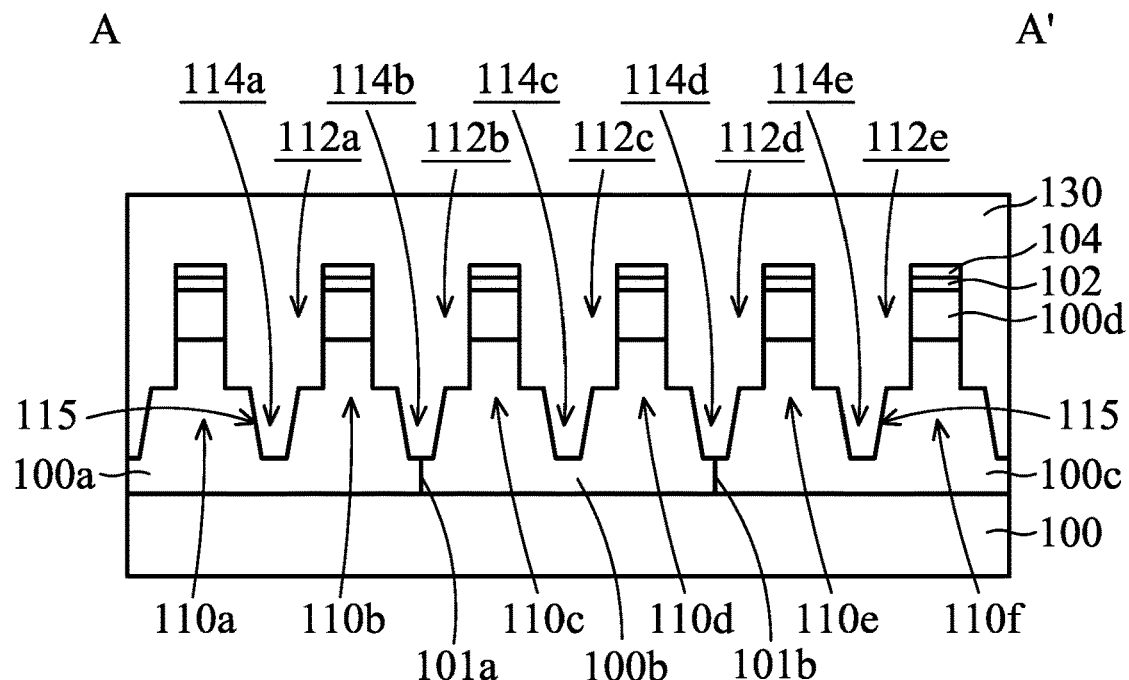

After the trenches 114a-114e are formed, an insulating material 130 is formed over the substrate 100 to cover the patterned second masking layers 104 over fin structures 110a-110f and fill the trenches 114a-114e and the trenches 112a-112e, as shown in FIGS. 1G and 2G in accordance with some embodiments. In some embodiments, the insulating material 130 is made of silicon oxide, fluorosilicate glass (FSG), a low-k dielectric material, and/or another suitable dielectric material or another low-k dielectric material. The insulating material 130 may be deposited by a chemical vapor deposition (CVD) process, a flowable CVD (FCVD) process, a spin-on-glass process, or another applicable process.

In some embodiments, the insulating spacers 120a are removed from the opposite sidewalls of the trenches 112a-112e prior to the formation of the insulating material 130, as shown in FIGS. 1G and 2G. In some other embodiments, the insulating spacers 120a are remained in the trenches 112a-112e during the formation of the insulating material 130. In those cases, the insulating spacer 120a may be made of a material that is the same as or similar to the insulating material 130.

Afterwards, the insulating material 130 is recessed to expose the top surface of the patterned second masking layer 104, in accordance with some embodiments. For example, the insulating material 130 over the top surface of the patterned second masking layer 104 is etched back or removed by a chemical mechanical polishing (CMP) process. After the top surface of the patterned second masking layer 104 is exposed, the patterned second masking layer 104 and the patterned first masking layer 102 are removed by one or more etching processes, so as to expose the top surfaces of the fin structures 110a-110f. For example, the patterned second masking layer 104 and the patterned first masking layer 102 are removed by a dry etching process, a wet etching process, or a combination thereof.

Figure 2H:
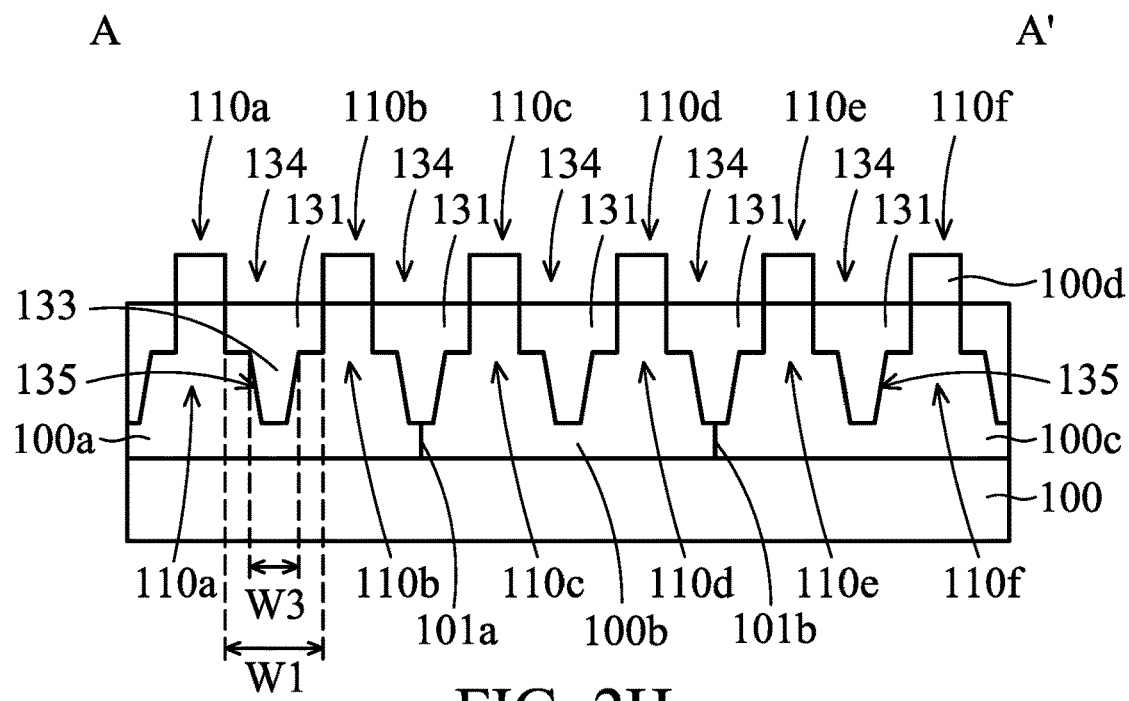

Afterwards, the insulating material 130 is further recessed to form an isolation feature over the substrate 100 and surrounding the fin structures 110a-110f, as shown in FIGS. 1H and 2H in accordance with some embodiments. In some embodiments, the insulating material 130 is recessed by an etching process (such as a dry etching process or a wet etching process, or a combination thereof), so that the top surface of the isolation feature is substantially level with the interfaces between the undoped region 100d and the well regions 100a-100c.

In some embodiments, the isolation feature made of the remaining insulating material 130 includes multi-step isolation structures 134. More specifically, each of the multi-step isolation structures 134 is formed between the corresponding two adjacent fin structures formed over the substrate 100. The multi-step isolation structure 134 includes a first isolation portion 131 (which may also be referred to an upper isolation portion) and a second isolation portion 133 (which may also be referred to a lower isolation portion). The first isolation portion 131 is formed in the corresponding trench (such as the trenches 112a-112f indicated in FIG. 2F) to correspond to the upper portions of the fin structures 110a-110f. The second isolation portion 133 is formed in the corresponding trench (such as the trenches 114a-114f indicated in FIG. 2F) to extend from the bottom surface of the first isolation portion 131 and to correspond to the lower portions of the fin structures 110a-110f. As a result, the second isolation portion 133 between the fin structure 110b and the fin structure 110c is formed directly above the well interface 101a. Also, the second isolation portion 133 between the fin structure 110d and the fin structure 110e is formed directly above the well interface 101b.

In some embodiments, the second isolation portion 133 has tilted sidewalls 135 and a top width (which is substantially equal to the top width W3 of the trenches 114a-114e shown in FIG. 2F) that is narrower than the bottom width of the first isolation portion 131 (which is substantially equal to the width W1 shown in FIG. 2C). Therefore, the first isolation portion 131 has a bottom area that is greater than the top area of the second isolation portion 133. As a result, the multi-step isolation structures 134 have a T-like shape and each of the fin structures 110a-110f has a reverse T-like shape corresponding to the T-like shape of the multi-step isolation structure 134.

The isolation feature that includes multi-step isolation structures 134 prevents electrical interference or crosstalk. A portion of each of the fin structures 110a-110f is embedded in and surrounded by the isolation feature. Compared to the use of a shallow trench isolation (STI) structure for prevention of electrical interference or crosstalk, the use of the multi-step isolation structure 134 can increase the isolation depth between the well regions (e.g., between the well region 100a and the well region 100b, or between the well region 100b and the well region 100c), thereby increasing the well leakage path. As a result, the latch-up phenomenon can be improved or prevented. Compared to the use of a deep trench isolation (DTI) structure for prevention of electrical interference or crosstalk, the use of the multi-step isolation structure 134 reduces the loss of the volume of the well regions 100a-100c near the well interfaces 101a and 101b. As a result, it can prevent the resistance of the well regions 100a-100c from being increased, and therefore the device's performance can be maintained or improved. In addition, the fin structures 110a-110f with the reverse T-like shape provide good mechanical strength, and therefore the fin collapse can be prevented. As a result, the yield of the semiconductor device can be increased.

Figure 2I:
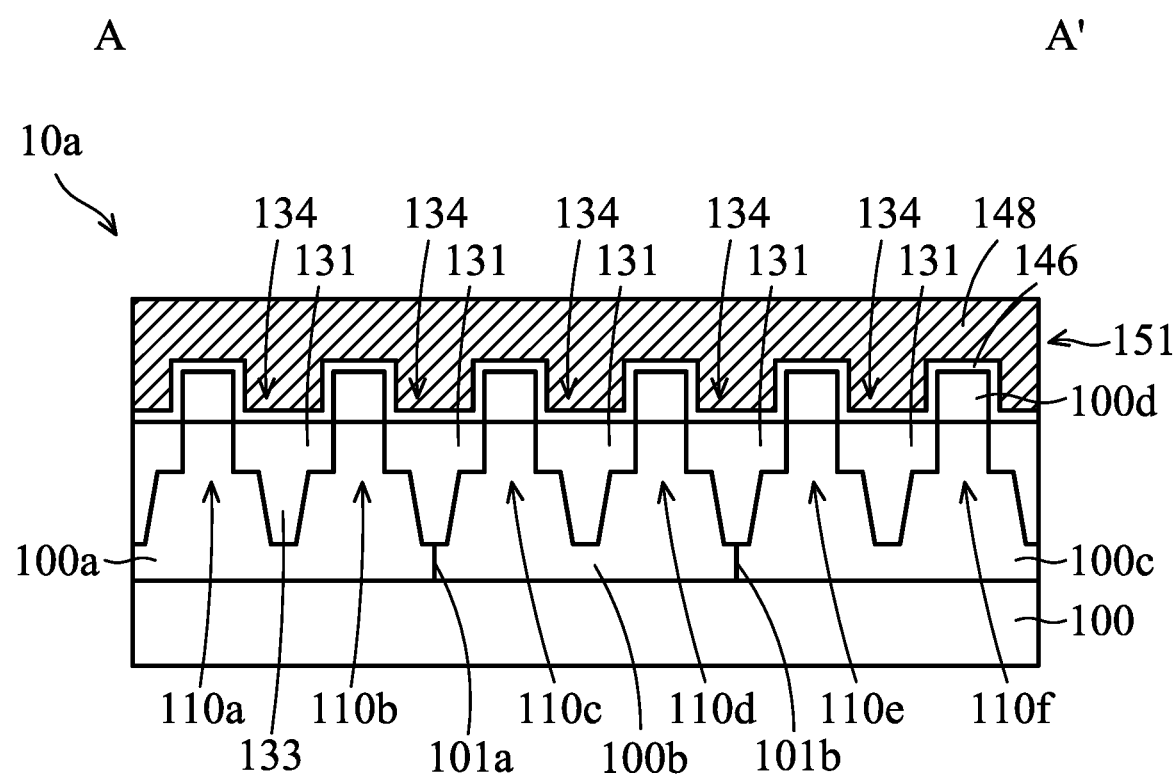

After the isolation feature including the multi-step isolation structures 134 are formed, source/drain features 140 are formed in the fin structures 110a-110f, and a gate structure 151 is formed across the fin structures 110a-110f, so as to form the semiconductor device structure 10a, as shown in FIGS. 1I and 2I in accordance with some embodiments. In some embodiments, a dummy gate structure (not shown) is formed across the fin structures 110a-110f and over the isolation feature including the multi-step isolation structures 134 before the formation of the source/drain features 140 and the gate structure 151.

In some embodiments, the dummy gate structure includes a dummy gate dielectric layer and a dummy gate electrode layer formed over the dummy gate dielectric layer. The dummy gate dielectric layer and the dummy gate electrode layer may be made of silicon oxide and polysilicon, respectively. Afterwards, gate spacers 136 are formed on the opposite sidewalls of the dummy gate structure in accordance with some embodiments. The gate spacer 136 may be made of low-K dielectric materials, silicon nitride, silicon oxide, silicon oxynitride, silicon carbide, or another applicable dielectric material.

After formation of the gate spacers 136, the source/drain features 140 are formed in the fin structures 110a-110f laterally adjacent to and exposed from the dummy gate structure, in accordance with some embodiments. In some embodiments, the source/drain structures 140 are formed by recessing the portions of the fin structures 110a-110f laterally adjacent to the dummy gate structure and growing semiconductor materials in the formed recesses in the fin structures 110a-110f by performing epitaxial (epi) growth processes.

After the source/drain features 140 are formed, an insulating layer 142 is formed over the fin structures 110a-110f and covers the isolation feature and the source/drain features 140, as shown in FIG. 1I in accordance with some embodiments. The insulating layer 142 may serve as an interlayer dielectric (ILD) layer and may be a single layer or include multiple dielectric layers with the same or different dielectric materials. For example, the insulating layer 142 may be a single layer made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 142 may be deposited using any suitable method, such as a chemical vapor deposition (CVD) process, a plasma enhanced CVD (PECVD) process, flowable CVD (FCVD) process, the like, or a combination thereof.

Afterwards, the dummy gate structure is removed and replaced by the gate structure 151, as shown in FIGS. 1I and 2I in accordance with some embodiments. In some embodiments, the gate structure 151 includes a gate dielectric layer 146, a gate electrode layer 148, and the gate spacers 136. The gate dielectric layer 146 may be made of metal oxides, metal nitrides, metal silicates, transition metal-oxides, transition metal-nitrides, transition metal-silicates, oxynitrides of metals, or other applicable dielectric materials. The gate electrode layer 148 may be made of a conductive material, such as aluminum, copper, tungsten, titanium, tantalum, or another applicable material. The gate structure may further include a work functional metal layer (not shown) between the gate dielectric layer 146 and the gate electrode layer 148, so that the gate structure has the proper work function values. The work function metal layer may be made of TiN, TaN, Ru, Mo, Al, WN, $ZrSi_2$, $MoSi_2$, $TaSi_2$, $NiSi_2$, WN, or a combination thereof. Alternatively, the work function metal layer may be made of Ti, Ag, TaAl, TaAlC, TiAlN, TaC, TaCN, TaSiN, Mn, Zr, or a combination thereof.

Figure 3A:
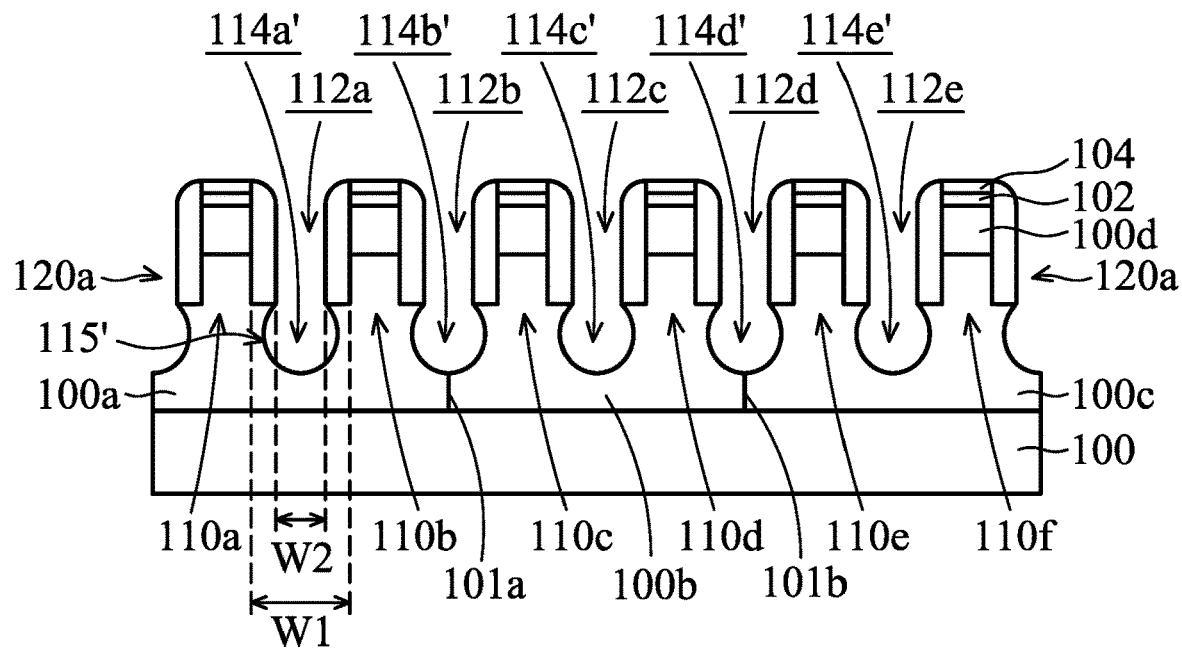
FIGS. 3A to 3D illustrate cross-sectional representations of various stages of manufacturing a semiconductor device structure in accordance with some embodiments.

Many variations and/or modifications can be made to embodiments of the disclosure. FIGS. 3A to 3D illustrate cross-sectional representations of various stages of manufacturing a semiconductor device structure 10b in accordance with some embodiments. The semiconductor device structure 10b shown in FIG. 3D is similar to the semiconductor device structure 10a shown in FIG. 2I. In some embodiments, the materials, formation methods, and/or benefits of the semiconductor device structure 10a shown in FIGS. 2A to 2I may also be applied in the embodiments illustrated in FIGS. 3A to 3D, and therefore may not be repeated.

In some embodiments, a structure as shown in FIG. 2E is provided. Afterwards, the exposed portions of the well regions 110a-110c below the trenches 112a-112e are etched using the insulating spacers 120a as an etch mask. Unlike the anisotropic etching process shown in FIG. 2F, the well regions 110a-110c of the substrate 100 are etched by an isotropic etching process, such as a wet etching process. After the isotropic etching process, each of the trenches 114a'-114e' has convex sidewalls 115'. Similar to the trenches 114a-114e shown in FIG. 2F, each of the trenches 114a'-114e' has a top width W3 that is substantially equal to the width W2 shown in FIG. 2E and less than the width W1 shown in FIG. 2C.

Figure 3B:
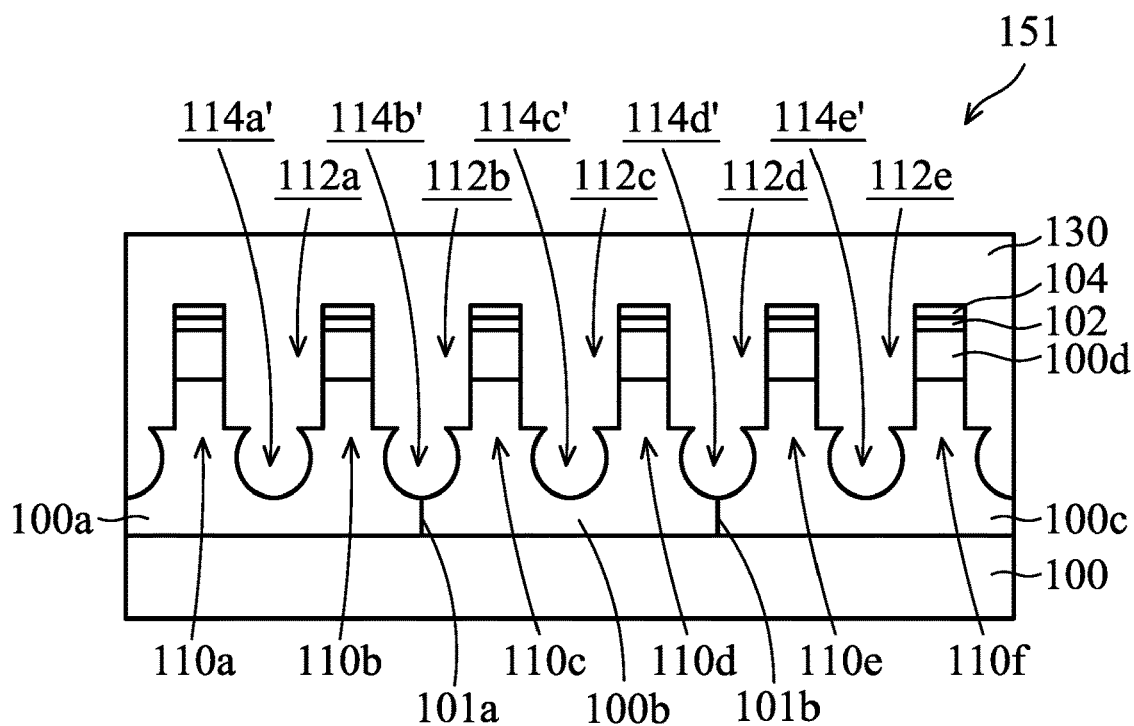

After the trenches 114a'-114e' are formed, an insulating material 130 is formed over the substrate 100 by a method that is the same as or similar to that shown in FIG. 2G, so as to cover the patterned second masking layers 104 over fin structures 110a-110f and fill the trenches 114a'-114e' and the trenches 112a-112e, as shown in FIG. 3B in accordance with some embodiments. In some embodiments, the insulating spacers 120a are removed from the opposite sidewalls of the trenches 112a-112e prior to the formation of the insulating material 130, as shown in FIG. 3B. In some other embodiments, the insulating spacers 120a are remained in the trenches 112a'-112e' during the formation of the insulating material 130.

Figure 3C:
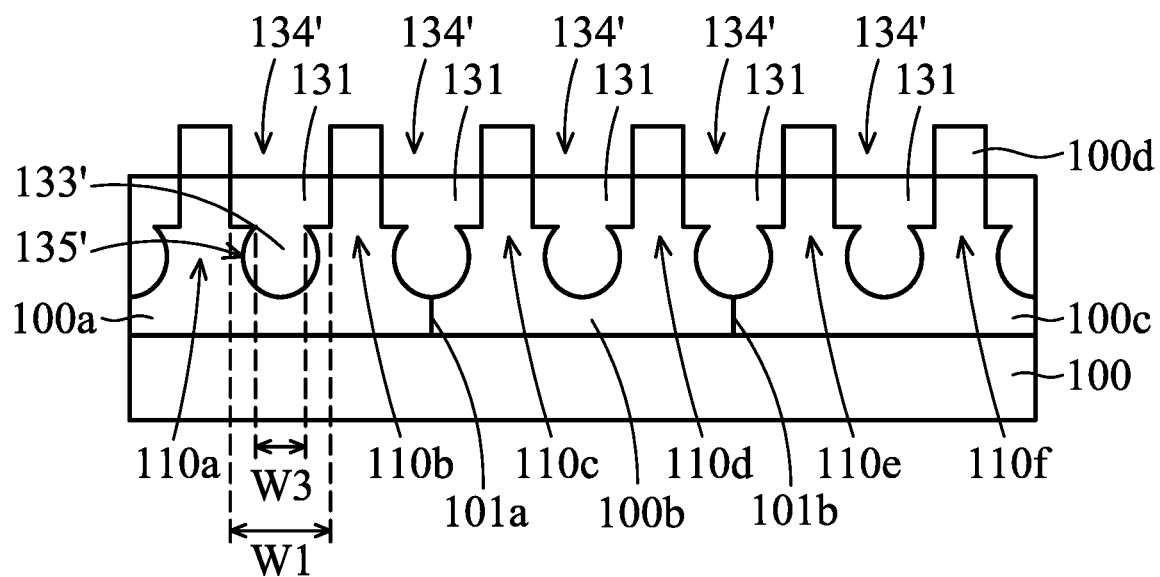
Figure 3D:
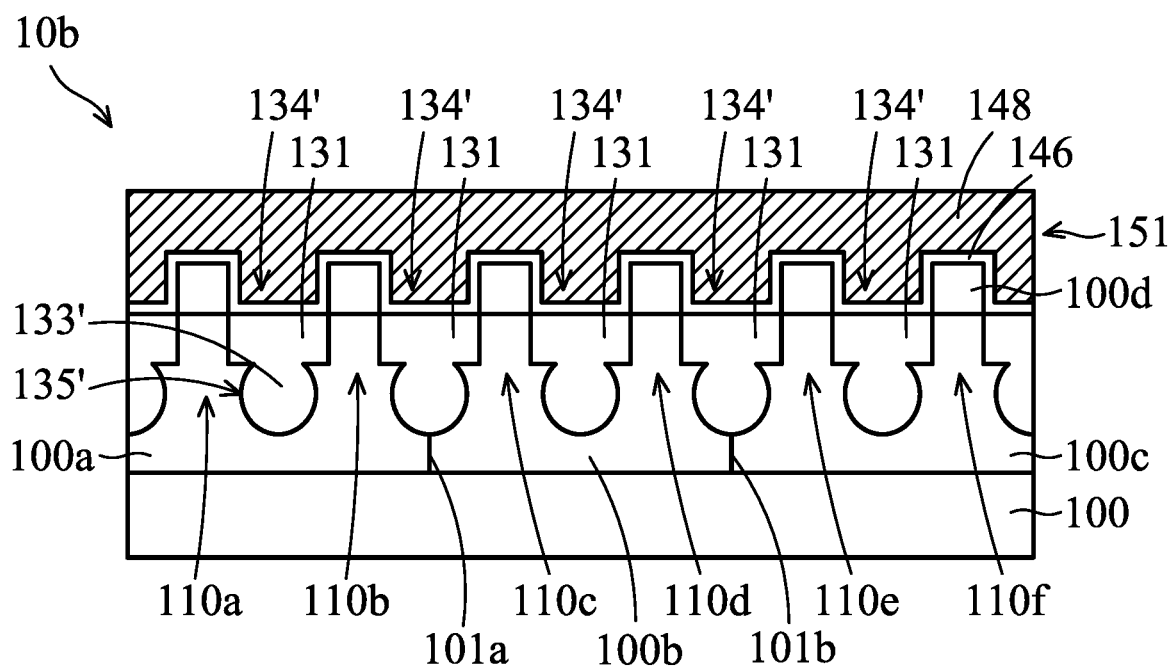

Afterwards, the insulating material 130 is recessed by a method that is the same as or similar to that shown in FIG. 2H, so as to form an isolation feature over the substrate 100 and surrounding the fin structures 110a-110f, as shown in FIG. 3C in accordance with some embodiments. In some embodiments, the isolation feature made of the remaining insulating material 130 includes multi-step isolation structures 134'. Unlike the multi-step isolation structures 134 shown in FIG. 2H, the multi-step isolation structure 134' includes a first isolation portion 131 and a second isolation portion 133' (which may also be referred to a lower isolation portion). The second isolation portion 133' has convex sidewalls 135' and a top width W3 (which is substantially equal to the top width W2 of the trenches 114a'-114e' shown in FIG. 3A) that is narrower than the bottom width of the first isolation portion 131 (which is substantially equal to the width W1 shown in FIG. 3A). Therefore, the first isolation portion 131 has a bottom area that is greater than the top area of the second isolation portion 133'. As a result, the multi-step isolation structures 134' have a T-like shape and each of the fin structures 110a-110f has a reverse T-like shape corresponding to the T-like shape of the multi-step isolation structure 134'.

Similar to the multi-step isolation structure 134 shown in FIG. 2H, the multi-step isolation structure 134' also can increase the well leakage path and reducing the loss of the volume of the well regions 100a-100c near the well interfaces 101a and 101b. Moreover, the fin structures 110a-110f with the reverse T-like shape provide good mechanical strength. In addition, the second isolation portion 133' with convex sidewalls 135' in the multi-step isolation structure 134' can prevent the reduction of the well leakage path when the well junctions (i.e., the well interfaces 101a and 101b) shifts in the formation of the well regions 110a-110c.

After the isolation feature including the multi-step isolation structures 134' is formed, a gate structure 151 is formed across the fin structures 110a-110f by a method that is the same as or similar to that shown in FIG. 2I, so as to form the semiconductor device structure 10b, as shown in FIG. 3D in accordance with some embodiments.

Figure 4A:
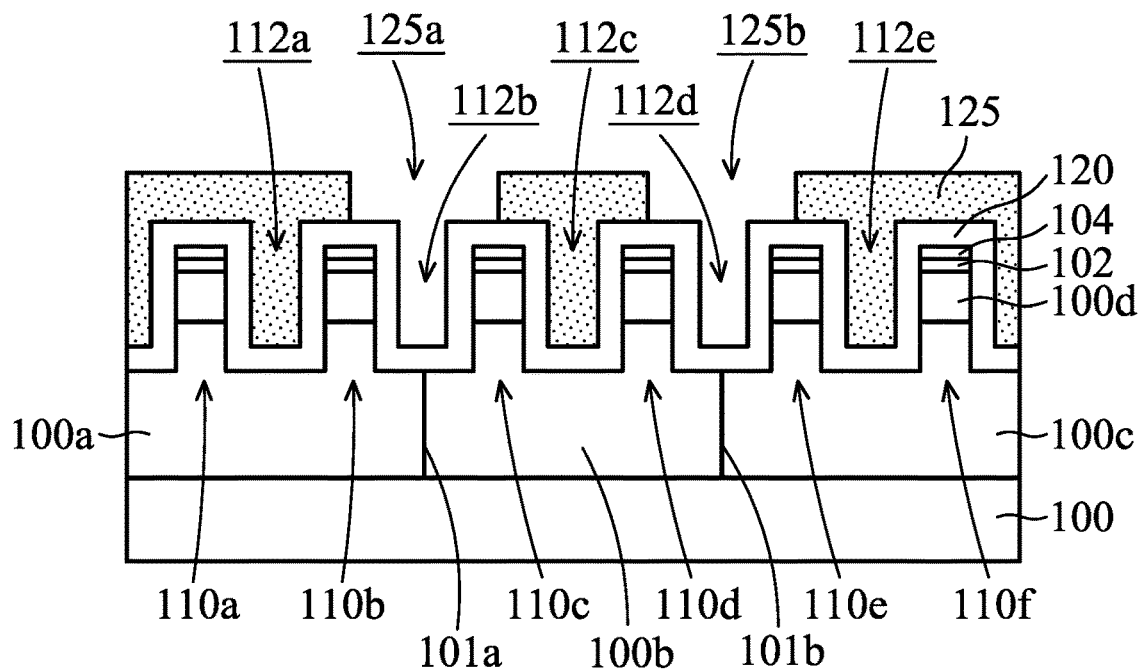
FIGS. 4A to 4D illustrate cross-sectional representations of various stages of manufacturing a semiconductor device structure in accordance with some embodiments.

Many variations and/or modifications can be made to embodiments of the disclosure. FIGS. 4A to 4D illustrate cross-sectional representations of various stages of manufacturing a semiconductor device structure 10a' in accordance with some embodiments. The semiconductor device structure 10a' shown in FIG. 4D is similar to the semiconductor device structure 10a shown in FIG. 2I. In some embodiments, the materials, formation methods, and/or benefits of the semiconductor device structure 10a shown in FIGS. 2A to 2I may also be applied in the embodiments illustrated in FIGS. 4A to 4D, and therefore may not be repeated.

In some embodiments, a structure as shown in FIG. 2D is provided. Afterwards, such a structure is covered by a patterned photoresist layer 125, as shown in FIG. 4A in accordance with some embodiments. In some embodiments, the patterned photoresist layer 125 includes trench openings 125a and 125b to respectively expose the trench 112b and the trench 112d which are covered by the insulating layer 120 and located respectively and directly above the well interface 101a and the well interface 101b.

The insulating layer 120 exposed from the trench openings 125a and 125b is etched by a method that is the same as or similar to that shown in FIG. 2E, so as to form insulating spacers 120a on opposite sidewalls of the trench 112b and the trench 112d and expose portions of the well regions 110a-110c including the well interfaces 101a and 101b under the trench 112b and the trench 112d, in accordance with some embodiments.

Figure 4B:
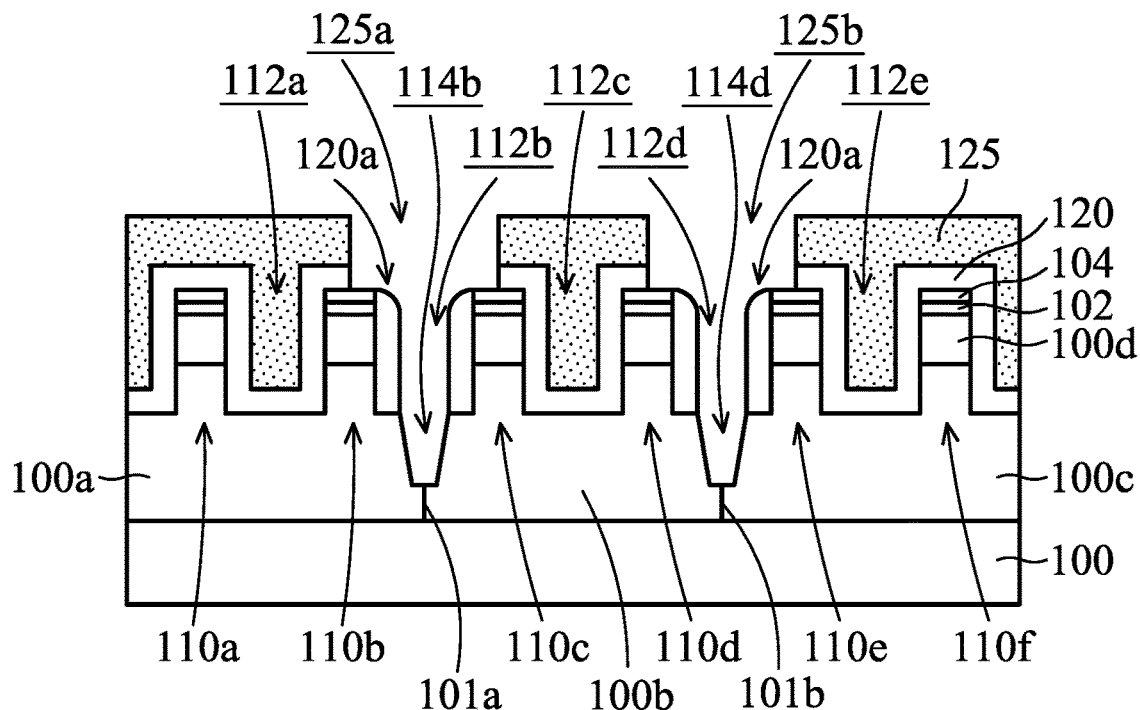

Afterwards, the exposed portions of the well regions 110a-110c under the trench 112b and the trench 112d are etched by a method that is the same as or similar to that shown in FIG. 2F, so as to respectively form the trench 114b and the trench 114d below the trench 112b and the trench 112d, as shown in FIG. 4B.

Figure 4C:
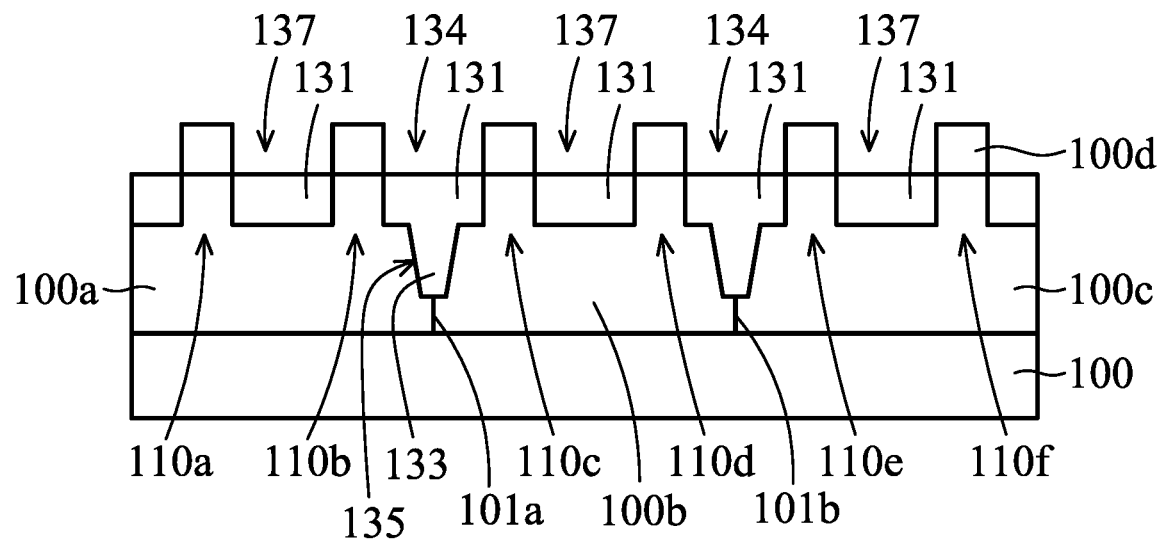
Figure 4D:
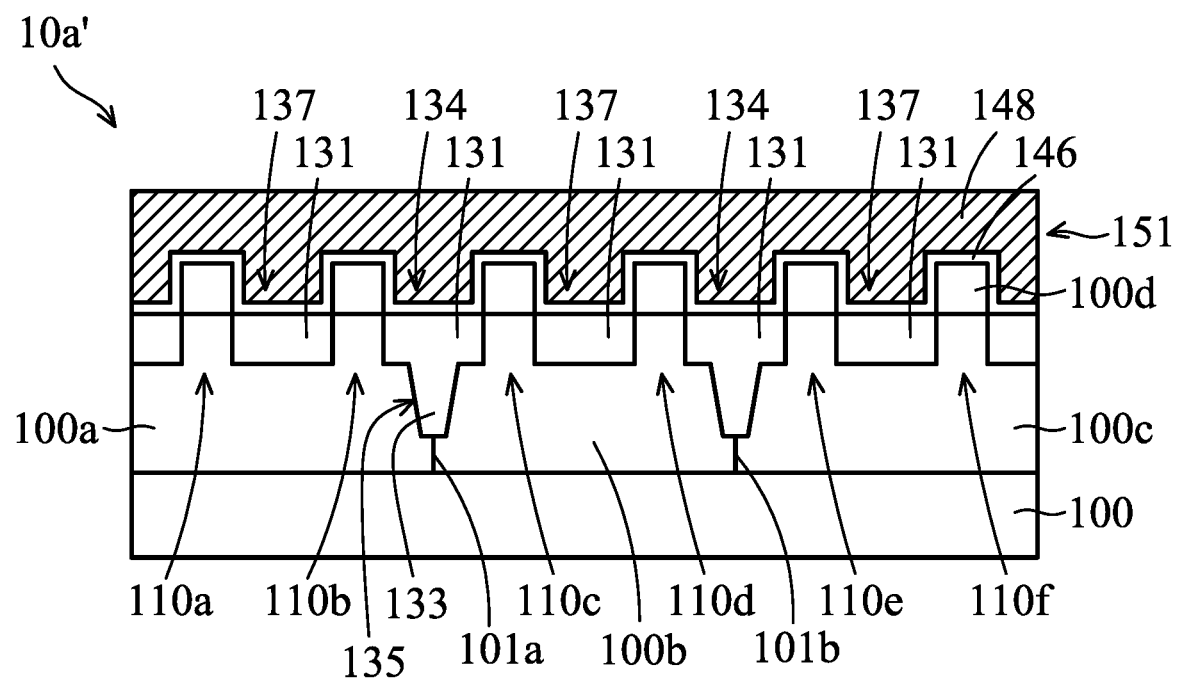

In some embodiments, the patterned photoresist layer 125 is removed after trench 114b and the trench 114d are formed. Afterwards, an isolation feature is formed over the substrate 100, as shown in FIG. 4C in accordance with some embodiments. In some embodiments, the isolation feature includes isolation structures 137 and multi-step isolation structures 134. More specifically, each of the isolation structures 137 includes a first isolation portion 131, and each of the multi-step isolation structures 134 includes a first isolation portion 131 and a second isolation portion 133 that has tilted sidewalls 135. In some embodiments, the isolation structures 137 are formed in the trench 112a, the trench 112c, and the trench 112e. Moreover, the multi-step isolation structures 134 are formed in the trenches 112b and 114b and the trenches 112d and 114d. As a result, the isolation structures 137 have a bottom surface that is substantially level with the bottom surface of the first isolation portion 131 of the multi-step isolation structures 134. The isolation structures 137 and the multi-step isolation structures 134 are formed by methods that are the same as or similar to those shown in FIGS. 2G and 2H, in accordance with some embodiments.

After the isolation feature including the isolation structures 137 and the multi-step isolation structures 134' is formed, a gate structure 151 is formed across the fin structures 110a-110f by a method that is the same as or similar to that shown in FIG. 2I, so as to form the semiconductor device structure 10a', as shown in FIG. 4D in accordance with some embodiments.

Figure 5A:
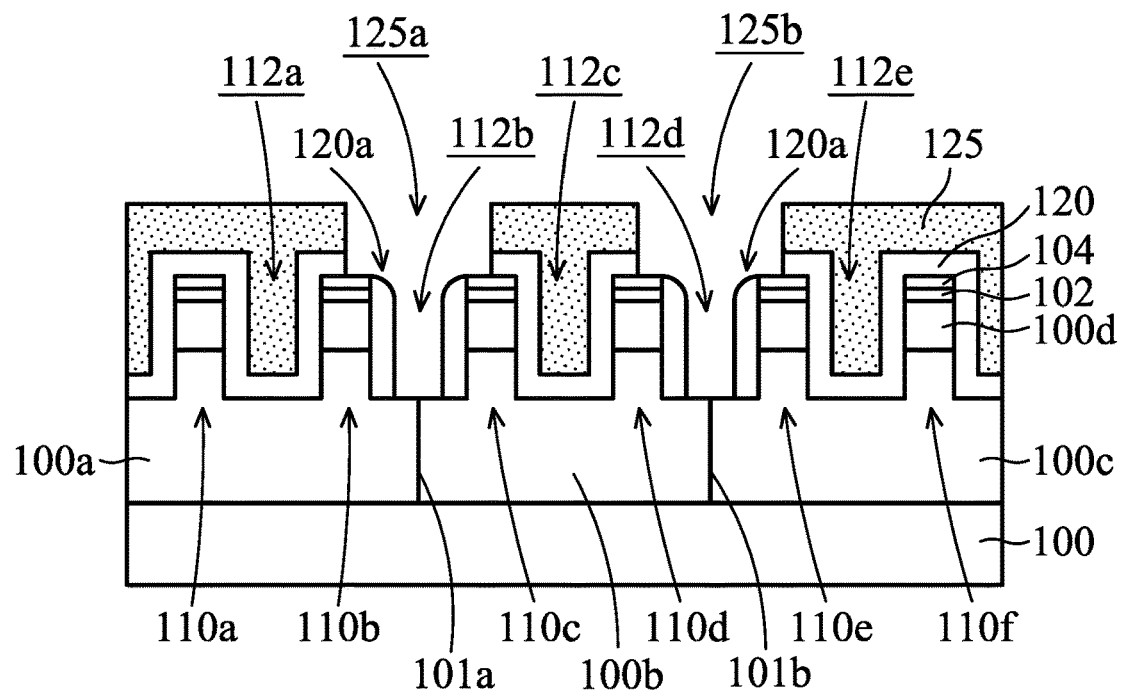
FIGS. 5A to 5D illustrate cross-sectional representations of various stages of manufacturing a semiconductor device structure in accordance with some embodiments.

Many variations and/or modifications can be made to embodiments of the disclosure. FIGS. 5A to 5D illustrate cross-sectional representations of various stages of manufacturing a semiconductor device structure 10b' in accordance with some embodiments. The semiconductor device structure 10b' shown in FIG. 5D is similar to the semiconductor device structure 10b shown in FIG. 3D and the semiconductor device structure 10a' shown in FIG. 4D. In some embodiments, the materials, formation methods, and/ or benefits of the semiconductor device structure 10b shown in FIGS. 3A to 3D and the semiconductor device structure 10a' shown in FIGS. 4A to 4D may also be applied in the embodiments illustrated in FIGS. 5A to 5D, and therefore may not be repeated.

In some embodiments, a structure as shown in FIG. 4A is provided. Afterwards, the insulating layer 120 exposed from the trench openings 125a and 125b are etched by a method that is the same as or similar to that shown in FIG. 4B, so as to form insulating spacers 120a on opposite sidewalls of the trench 112b and the trench 112d and expose portions of the well regions 110a-110c including the well interfaces 101a and 101b under the trench 112b and the trench 112d, as shown in FIG. 5A in accordance with some embodiments.

Figure 5B:
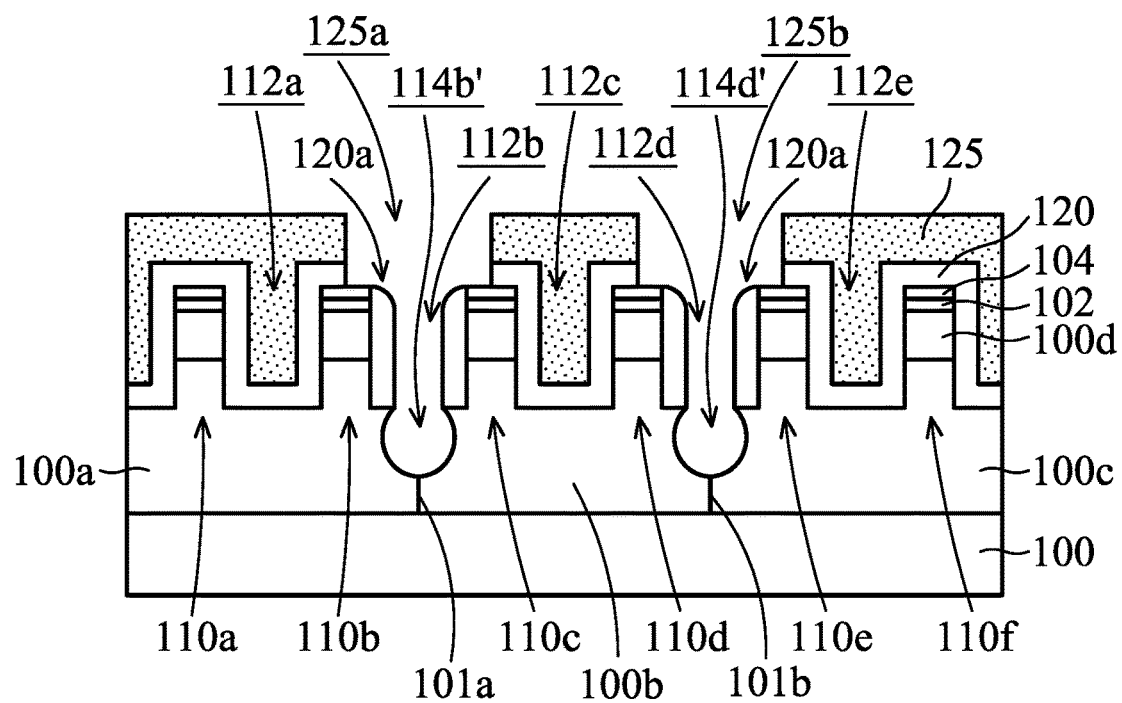

After the insulating spacers 120a are formed, the exposed portions of the well regions 110a-110c under the trench 112b and the trench 112d are etched by a method that is the same as or similar to that shown in FIG. 3A, so as to respectively form the trench 114b' and the trench 114d' below the trench 112b and the trench 112d, as shown in FIG. 5B.

Figure 5C:
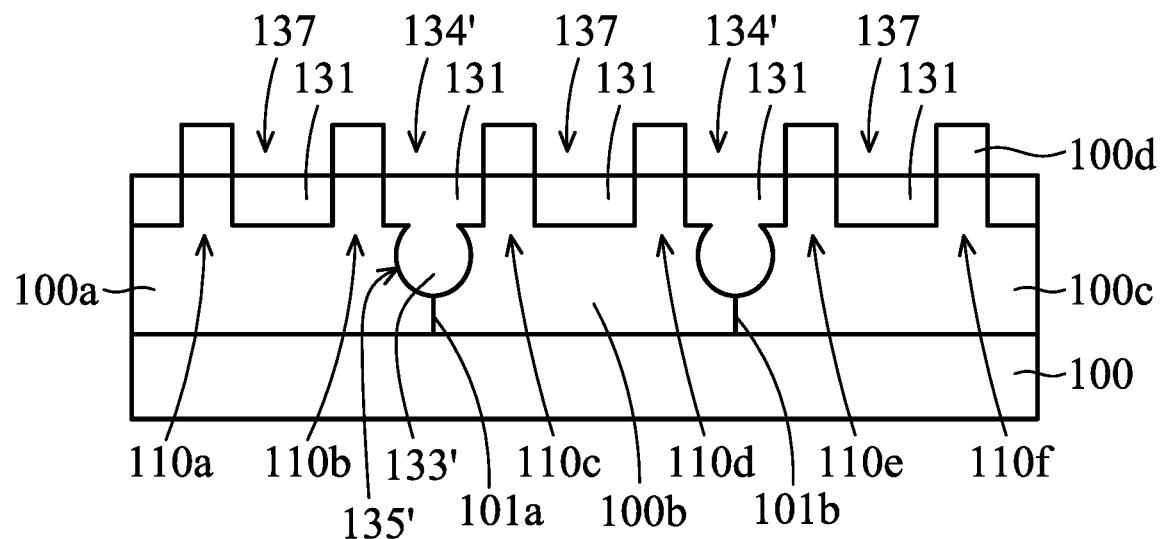
Figure 5D:
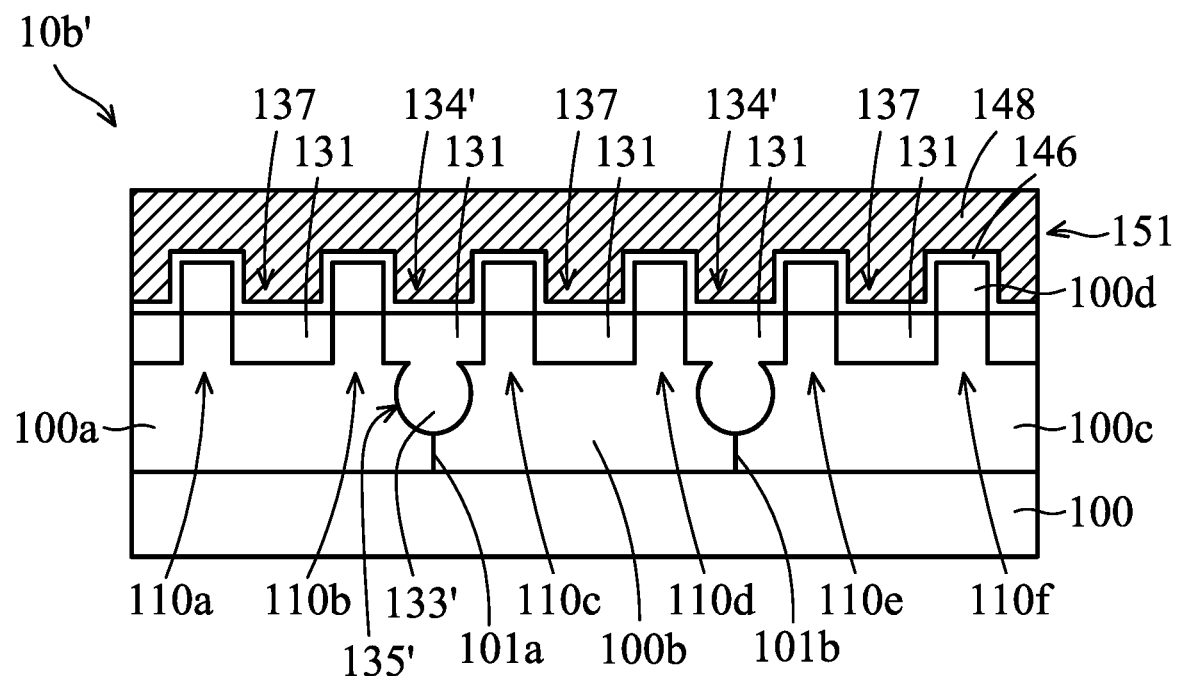

In some embodiments, the patterned photoresist layer 125 is removed after trench 114b' and the trench 114d' are formed. Afterwards, an isolation feature is formed over the substrate 100, as shown in FIG. 5C in accordance with some embodiments. In some embodiments, the isolation feature includes isolation structures 137 and multi-step isolation structures 134'. In some embodiments, similar to the semiconductor device structure 10a' shown in FIG. 4D, each of the isolation structures 137 includes a first isolation portion 131, and the isolation structures 137 are formed in the trench 112a, the trench 112c, and the trench 112e. In some embodiments, similar to the semiconductor device structure 10b shown in FIG. 3D, each of the multi-step isolation structures 134' includes a first isolation portion 131 and a second isolation portion 133' that has convex sidewalls 135', and the multi-step isolation structures 134 are formed in the trenches 112b and 114b and the trenches 112d and 114d. As a result, the isolation structures 137 have a bottom surface that is substantially level with the bottom surface of the first isolation portion 131 of the multi-step isolation structures 134'. The isolation structures 137 and the multi-step isolation structures 134' are formed by methods that are the same as or similar to those shown in FIGS. 3B and 3C, in accordance with some embodiments.

After the isolation feature including the isolation structures 137 and the multi-step isolation structures 134' is formed, a gate structure 151 is formed across the fin structures 110a-110f by a method that is the same as or similar to that shown in FIG. 3D, so as to form the semiconductor device structure 10a', as shown in FIG. 5D in accordance with some embodiments.

Embodiments of semiconductor device structures and methods for forming the same are provided. The formation of the semiconductor device structure includes forming a first fin structure over a semiconductor substrate and in a first well region of first conductivity type in the semiconductor substrate, and a second fin structure over the semiconductor substrate and in the second well region of an opposite second conductivity type in the semiconductor substrate. Afterwards, a multi-step isolation structure is formed between the first fin structure and the second fin structure. The multi-step isolation structure includes a first isolation portion and a second isolation portion extending from a bottom surface of the first isolation portion. The second isolation portion has a top width that is narrower than the bottom width of the first isolation portion. In the multi-step isolation structure, since the isolation depth increases between the adjacent well regions, leakage (which may cause latch-up) between the adjacent well regions can be reduced. Since the lower portion (i.e., the second isolation portion) of the multi-step isolation structure has a top width that is narrower than the bottom width of the upper portion (i.e., the first isolation portion) of the multi-step isolation structure first isolation feature, the fins can have a reverse T-like shape. As a result, the mechanical strength of the fin structures can be increased, thereby preventing fin collapse, and therefore the yield of the semiconductor device can be improved. In addition, compared to one-step deep trench isolation technology for latch-up prevention, the loss of the well volume can be mitigated by the use of the multi-step isolation structure. As a result, it can prevent the resistance of the well region from being increased, and therefore the device's performance can be maintained or improved.

In some embodiments, a semiconductor device structure is provided. The semiconductor device structure includes a first fin structure and an adjacent second fin structure protruding from the semiconductor substrate. The semiconductor device structure includes an isolation structure formed in the semiconductor substrate and in direct contact with the first fin structure and the second fin structure. The first fin structure and the second fin structure each includes: a first portion protruding above a top surface of the isolation structure; a second portion in direct contact with a bottom surface of the first portion, so that an interface is formed between the first portion and the second portion; and a third portion extending from a bottom of the second portion. The top width of the third portion is different than the bottom width of the third portion and the bottom width of the second portion.

In some embodiments, a semiconductor device structure is provided. The semiconductor device structure includes fin structures protruding from a semiconductor substrate. The semiconductor device structure also includes isolation structures formed in the semiconductor substrate and alternately arranged with the plurality of fin structures. Each of the fin structures has an upper region and a lower region with different doping concentrations and the upper region protrudes above a top surface of the isolation structures. The bottom of each of the fin structures is substantially level with the bottom of each of the isolation structures. The bottom width of each of the fin structures is greater than the bottom width of each of the isolation structures.

In some embodiments, a semiconductor device structure is provided. The semiconductor device structure includes a semiconductor substrate having a lower region and a plurality of upper regions extending from the lower region and having a doping concentration different from that of the lower region. The semiconductor device structure also includes first isolation structures formed in a semiconductor substrate and exposed from the upper regions. The semiconductor device structure further includes second isolation structures formed in the semiconductor substrate, alternately arranged with the first isolation structures, and exposed from the upper regions. Each of the first isolation structures has a vertical thickness greater than that of each of the second isolation structures and includes a first isolation portion having a bottom that is substantially level with the bottom of each of the second isolation structures, and a second isolation portion extending from the bottom of the first isolation portion. The second isolation portion has a top width that is different than the bottom width of the second isolation portion and the bottom width of the first isolation portion.

In some embodiments, a semiconductor device structure is provided. The semiconductor device structure includes a semiconductor substrate including a first well region of a first conductivity type. The semiconductor device structure also includes a first fin structure and an adjacent second fin structure formed in and protruding from the first well region. The semiconductor device structure also includes a first isolation structure formed in the first well region between the first fin structure and the second fin structure. A first sidewall surface of the first fin structure faces to a second sidewall surface of the second fin structure. The first sidewall surface and the second sidewall surface each extend along at least two directions from a bottom of the first isolation structure to a top of the first isolation structure.

In some embodiments, a semiconductor device structure is provided. The semiconductor device structure includes a first fin structure formed in a first well region of a semiconductor substrate and extending above a top of the first well region. The semiconductor device structure also includes a second fin structure formed in a second well region of a semiconductor substrate, extending above a top of the second well region, and in contact with the first fin structure. The first well region and second well region have different conductivity types. The semiconductor device structure further includes a first isolation structure formed in the first well region and the second region, including an upper portion having a first vertical sidewall surface in the first well region and a second vertical sidewall surface in the second well region, and a lower region extending from a bottom of the upper portion and having an outer surface with a curved contour. The first fin structure extending above the top of the first well region and the second fin structure extending above the top of the second well region are undoped regions. A distance between the undoped regions is greater than a top width of the lower portion of the first isolation structure.

In some embodiments, a semiconductor device structure is provided. The semiconductor device structure includes a semiconductor substrate having a first well region, a second well region, and a third well region between the first well region and the second well region. The semiconductor device structure also includes a first isolation structure formed in the first well region and the third well region, a second isolation structure formed in the second well region and the third well region, and a third isolation structure formed in the third well region between the first isolation structure and the second isolation structure. An outer surface contour of the third isolation structure is different than outer surface contours of the first isolation structure and the second isolation structure. A first fin structure and a second fin structure formed in the third well region, and protruding above and separated from each other by the third isolation structure.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate comprising a first well region of a first conductivity type;
   a first fin structure and an adjacent second fin structure formed in and protruding from the first well region, wherein a first sidewall surface of the first fin structure faces to a second sidewall surface of the second fin structure; and
   a first isolation structure formed in the first well region between the first fin structure and the second fin structure;
   wherein the first sidewall surface and the second sidewall surface each extend along at least two directions from a bottom of the first isolation structure to a top of the first isolation structure.

2. The semiconductor device structure as claimed in claim 1, further comprising:
   a second isolation structure separated from the first isolation structure by the first fin structure; and
   a third isolation structure separated from the first isolation structure by the second fin structure.

3. The semiconductor device structure as claimed in claim 2, wherein the first fin structure has a third sidewall surface opposite to the first sidewall surface and the second fin structure has a fourth sidewall surface opposite to the second sidewall surface, wherein the third sidewall surface extends along at least two directions from a bottom of the second isolation structure to a top of the second isolation, and wherein the fourth sidewall surface extends along at least two directions from a bottom of the third isolation structure to a top of the third isolation structure.

4. The semiconductor device structure as claimed in claim 2, wherein the semiconductor further comprises a second well region of a second conductivity type different than the first conductivity type.

5. The semiconductor device structure as claimed in claim 4, wherein the third isolation structure is formed in the second well region of the semiconductor substrate.

6. The semiconductor device structure as claimed in claim 5, wherein a bottom of the third isolation structure is directly on a well interface between the first well region and the second well region.

7. The semiconductor device structure as claimed in claim 4, further comprising:
   a third fin structure formed in and protruding from the second well region, wherein a third sidewall surface of the third fin structure is in direct to the third isolation structure, wherein the third sidewall surface extends along at least two directions from a bottom of the third isolation structure to a top of the third isolation.

8. The semiconductor device structure as claimed in claim 1, wherein the first fin structure and the second fin structure each comprise:
   a first portion with a top surface that is substantially level with a top surface of the first isolation structure; and a second portion extending from a bottom of the first portion.

9. The semiconductor device structure as claimed in claim 8, wherein portions of the first sidewall surface and the second sidewall surface corresponding to the first portion are vertical sidewall surfaces and portions of the first sidewall surface and the second sidewall surface corresponding to the second portion are tilted sidewall surfaces.

10. The semiconductor device structure as claimed in claim 8, wherein the first fin structure and the second fin structure each further comprise a third portion formed over the first portion, and wherein the third portion is an undoped region.

11. The semiconductor device structure as claimed in claim 10, wherein a bottom width of the third portion is substantially equal to a bottom width of the first portion and less than a top width of the second portion.

12. The semiconductor device structure as claimed in claim 1, further comprising a gate structure over the first fin structure and the second fin structure, wherein the gate structure comprises:
 a gate dielectric layer; and
 a gate electrode layer formed over the gate dielectric layer.

13. A semiconductor device structure, comprising:
 a first fin structure formed in a first well region of a semiconductor substrate and extending above a top of the first well region;
 a second fin structure formed in a second well region of a semiconductor substrate, extending above a top of the second well region, and in contact with the first fin structure, wherein the first well region and second well region have different conductivity types; and
 a first isolation structure formed in the first well region and the second well region, comprising:
  an upper portion having a first vertical sidewall surface in the first well region and a second vertical sidewall surface in the second well region; and
  a lower region extending from a bottom of the upper portion and having an outer surface with a curved contour;
 wherein the first fin structure extending above the top of the first well region and the second fin structure extending above the top of the second well region are undoped regions, and wherein a distance between the undoped regions is greater than a top width of the lower region of the first isolation structure.

14. The semiconductor device structure as claimed in claim 13, further comprising:
 a second isolation structure formed in the first well region and separated from the first isolation structure by the first fin structure; and
 a third isolation structure formed in the second well region and separated from the first isolation structure by the second fin structure,
 wherein the first isolation structure, the second isolation structure, and the third isolation structure have a same outer surface contour.

15. The semiconductor device structure as claimed in claim 13, wherein each of the first fin structure and the second fin structure comprises:
 a first portion formed above the top of the first well region and the top of the first well region; and
 a second portion extending from a bottom of the first portion,
 wherein the second portion has a first width that is greater than a top width of the first portion and a second width that is substantially equal to the top width of the first portion.

16. The semiconductor device structure as claimed in claim 15, further comprising:
 a gate dielectric layer lining the first portion of the first fin structure and the first portion of the second fin structure; and
 a gate electrode layer over the gate dielectric layer.

17. A semiconductor device structure, comprising:
 a semiconductor substrate having a first well region, a second well region, and a third well region between the first well region and the second well region;
 a first isolation structure formed in the first well region and the third well region;
 a second isolation structure formed in the second well region and the third well region;
 a third isolation structure formed in the third well region between the first isolation structure and the second isolation structure, wherein an outer surface contour of the third isolation structure is different than outer surface contours of the first isolation structure and the second isolation structure; and
 a first fin structure and a second fin structure formed in the third well region, and protruding above and separated from each other by the third isolation structure.

18. The semiconductor device structure as claimed in claim 17, wherein each of the first isolation structure and the second isolation structure comprises:
 a first portion; and
 a second portion extending from a bottom of the first portion,
 wherein a top width of the second portion is less than a bottom width of the first portion, and wherein the bottom width of the first portion is substantially equal to a bottom width of the third isolation structure.

19. The semiconductor device structure as claimed in claim 17, wherein the first well region and the second well region have a first conductivity type and the third well region has a second conductivity type.

20. The semiconductor device structure as claimed in claim 17, further comprising:
 a gate dielectric layer formed over the first fin structure; and
 a gate electrode layer formed over the gate dielectric layer.

* * * * *